United States Patent
Ikeda et al.

(10) Patent No.: US 6,452,806 B2
(45) Date of Patent: *Sep. 17, 2002

(54) FRAME FOR IC CARD

(76) Inventors: Takashi Ikeda, c/o Shinko Electric Industries Co., Ltd., 711, Aza Sharidien, Oaza Kurita, Nagano-shi, Nagano 380-0921 (JP); Masatoshi Akagawa, c/o Shinko Electric Industries Co., Ltd., 711, Aza Sharidien, Oaza Kurita, Nagano-shi, Nagano 380-0921 (JP); Daisuke Ito, c/o Shinko Electric Industries Co., Ltd., 711, Aza Sharidien, Oaza Kurita, Nagano-shi, Nagano 380-0921 (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/768,607

(22) Filed: Jan. 25, 2001

Related U.S. Application Data

(63) Continuation of application No. 09/402,946, filed as application No. PCT/JP99/00581 on Feb. 10, 1999, now Pat. No. 6,252,777.

(30) Foreign Application Priority Data

Feb. 13, 1998 (JP) ............................................. 10-31624
Mar. 12, 1998 (JP) ............................................. 10-60916
Sep. 7, 1998 (JP) ............................................ 10-252920

(51) Int. Cl.[7] ................................................ H05K 1/14
(52) U.S. Cl. ........................ 361/737; 361/736; 361/727; 257/679; 174/52.1
(58) Field of Search ................................ 361/737, 736, 361/727–730; 257/679, 678, 692, 700; 174/52.1, 52.2

(56) References Cited

U.S. PATENT DOCUMENTS

| | | | | |
|---|---|---|---|---|
| 5,598,032 A | * | 1/1997 | Fidalgo | 257/679 |
| 5,705,852 A | | 1/1998 | Ohrihara et al. | 257/679 |
| 5,946,198 A | | 8/1999 | Hoppe et al. | 361/813 |
| 5,962,840 A | | 10/1999 | Haghiri-Tehrani et al. | 235/492 |
| 5,969,951 A | | 10/1999 | Fischer et al. | 361/737 |
| 6,049,461 A | * | 4/2000 | Haghiri-Tehrani et al. | 361/737 |
| 6,081,025 A | * | 6/2000 | Prancz | 257/679 |
| 6,255,725 B1 | * | 7/2001 | Akagawa et al. | 257/679 |

FOREIGN PATENT DOCUMENTS

| | | |
|---|---|---|
| JP | 63-104128 | 9/1963 |
| JP | 6-310324 | 11/1994 |
| JP | 8-287208 | 11/1996 |
| TW | 355777 | 4/1999 |

* cited by examiner

Primary Examiner—David L. Talbott
Assistant Examiner—Tuan Dinh

(57) ABSTRACT

An IC card, which can be mass-produced at low cost, is composed of a plane coil formed by means of punching or etching. The plane coil 10 in which a conductor line 11 is wound a plurality of times in substantially the same plane is formed by punching, terminals 10a, 10b of the plane coil 10 and electrode terminals 12a, 12b of the semiconductor element 12 are electrically connected to each other, the plane coil 10 is provided with an outside terminal 10a formed outside the coil and an inside terminal formed inside the coil, the semiconductor element 12 is arranged in such a manner that a forming face on which the electrode terminals 12a, 12b are formed or a plane reverse to the forming face is opposed to the conductor line 11 of the plane coil 10, the electrode terminals 12a, 12b of the semiconductor element 12 are respectively located adjacent to the outside terminal 10a and the inside terminal 10b of the plane coil 10, and the electrode terminals 12a, 12b are electrically connected to the terminals 10a, 10b of the plane coil 10 located on the same side with respect to the inside and outside of the coil.

15 Claims, 27 Drawing Sheets

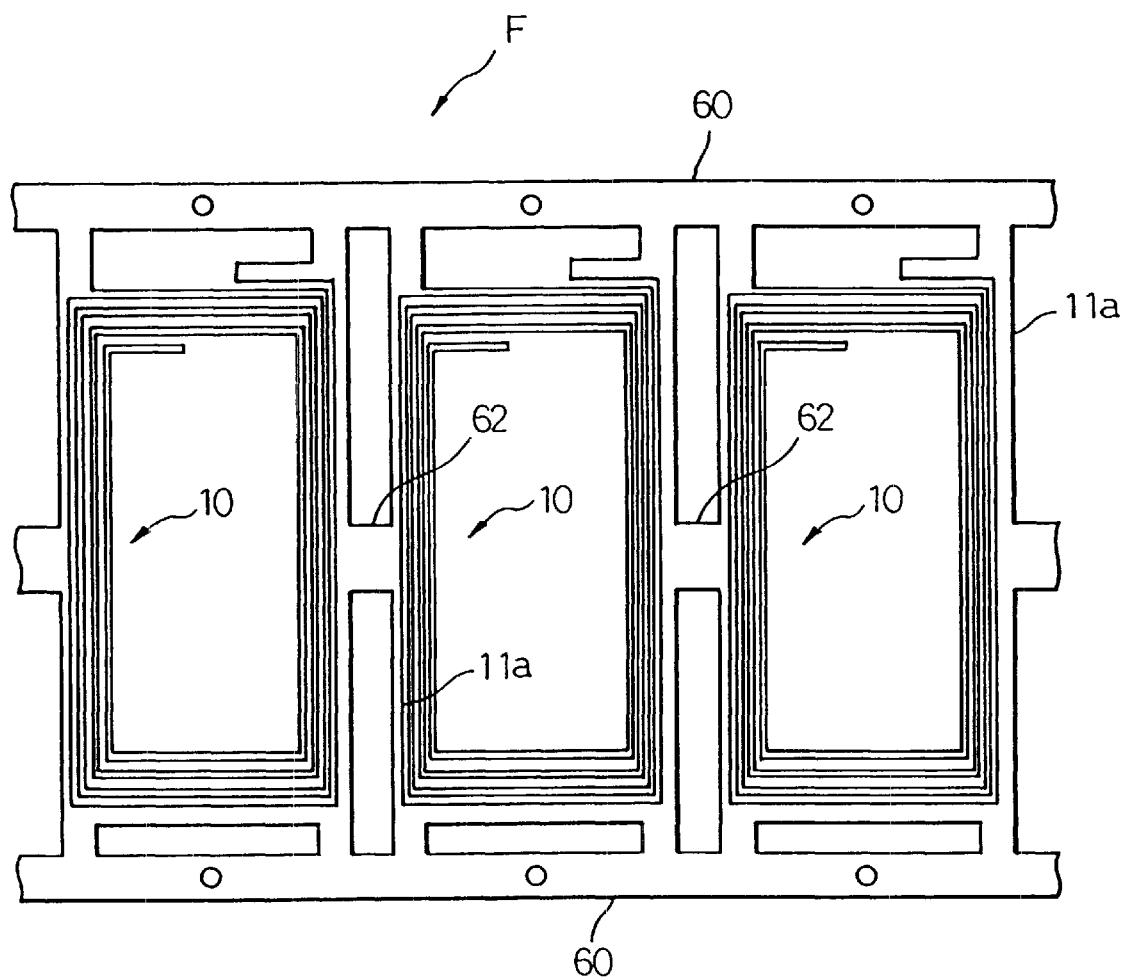

DESCRIPTION OF REFERENCE NUMERALS

10 ... plane coil
10a, 10b ... terminal of plane coil 10
11 ... conductor line
12 ... semiconductor element
12a, 12b ... terminal of semiconductor element 12
14 ... recess
16 ... connecting face of terminal 10b (10a)
18 ... wire
20a, 20b ... resin film
22a, 22b ... adhesive layer
25 ... supporting wire
27 ... wall
30 ... connecting metallic member
32 ... protrusion
33 ... recess
40 ... module body
44 ... bump
46 ... lead
47 ... connecting section
50 ... sealing resin (mold resin)
52 ... sealing resin (potting resin)
54 ... connecting portion
60 ... rail
62 ... connecting portion

FRAME FOR IC CARD

The present application is a continuation of U.S. patent application Ser. No. 09/402,946, filed Oct. 13, 1999 now U.S. Pat. No. 6,252,777, which is a 371 of application No. PCT/JP99/00581, filed Feb. 10, 1999.

FIELD OF THE INVENTION

The present invention relates to an IC card and a frame used in the IC card. More particularly, the present invention relates to an IC card and a frame used in the IC card having a plane coil-formed by punching or etching, in which a conductor line is wound a plurality of times on substantially the same plane, and terminals of the plane coil and electrode terminals of a semiconductor element are electrically connected to each other in the IC card.

DESCRIPTION OF THE BACKGROUND ART

An IC card is composed of a plane coil, in which a conductor line is wound a plurality of times, and a semiconductor element. The plane coil and other parts are enclosed and sealed by an adhesive layer made of polyurethane which is formed inside a resin film made of PVC, which forms a front surface and a back surface of the IC card, and letters are printed on a surface of the resin film.

When the thus formed IC card passes through a magnetic field formed by a card processor, electric power is generated by electromagnetic induction caused in the plane coil of the IC card. Therefore, the semiconductor element is started by the generated electric power, so that communication can be performed between the semiconductor element of the IC card and the card processor via the plane coil which functions as an antenna.

Concerning the conventional plane coil incorporated into the IC card, there is provided an insulated plane coil which is formed in such a manner that an insulation covered electric wire is wound, and also there is provided a plane coil which is formed in such a manner that a conductor line is formed when metallic foil formed on a resin film is etched.

In this connection, in order to promote the spread of IC cards, it is necessary to reduce the cost of IC cards and also it is necessary to mass-produce them. However, in the case of the above IC card in which the conventional plane coil is used, it is difficult to reduce the cost of the plane coil. Also, it is difficult to sufficiently mass-produce IC cards.

Therefore, Japanese Unexamined Patent Publication No. 6-310324 discloses an IC card into which a plane coil, which is formed by punching, is incorporated.

As proposed in the above patent publication, when the plane coil is formed by punching, the cost of the IC card can be reduced and the IC card can be mass-produced as compared with the IC card into which the conventional plane coil is incorporated.

FIG. 50 is a view showing a conventional plane coil 100 formed by punching. In this plane coil 100, terminals 102 and 104 are respectively formed inside and outside the coil.

Due to the above structure, a wire 114, which is one of the wires 112, 114 for connecting the terminals 102, 104 of the plane coil 100 with the electrode terminals 108, 110 of the semiconductor element 106, crosses a conductor wire 101 which forms the plane coil 100. Accordingly, when insulating covered wires are used for the wires 112, 114, the cost is raised, and a reduction in the cost of the IC card is difficult.

On the other hand, when a non-insulating wire is used for the wire 112 which does not cross the plane coil 100 and when an insulating covered wire is used for the wire 114 which crosses the plane coil 100, it becomes necessary to use two types of wires, and the manufacturing process of IC cards becomes complicated. Therefore, it is difficult to reduce the cost of IC cards and mass-produce them.

Since the thickness of the IC card is not more than 1 mm, it is necessary to form a very thin IC card. Further, plane coils formed by punching must be easy to handle when they are transported, and semiconductor elements must be appropriately incorporated into the plane coils.

SUMMARY OF THE INVENTION

The first task to be accomplished by the present invention is to provide an IC card into which a plane coil formed by punching is incorporated and the cost of the IC card can be reduced and, further, the IC card can be subjected to mass production.

The second task to be accomplished by the present invention is to provide a frame for an IC card which can be easily mass-produced and transported, and further the frame can be used for a thin IC card. Also, the second task to be accomplished by the present invention is to provide an IC card which can be easily mass-produced and the thickness of which can be appropriately decreased.

In order to accomplish the above first task, the present inventors have investigated and found the following. In general, a surface of a semiconductor element except for an electrode terminal is covered with a passivation film, so that it is electrically insulated. Therefore, a portion of the semiconductor element except for the electrode terminal may be contacted with a conductor line of the plane coil, and when the electrode terminal of the semiconductor element is arranged on the plane coil side, the terminal of the plane coil can be arranged close to the electrode terminal of the semiconductor element.

Therefore, the present inventors arranged the semiconductor element 106 so that the electrode terminals 108, 110 could be located on the conductor line 101 side with respect to the plane coil 100, and the electrode terminals 108, 110 of the semiconductor element 106 were bonded to the terminals 102, 104 of the plane coil 100 with wires. In this IC card, it is unnecessary to cover the wire, for the purpose of insulation, which connects the plane coil 100 with the semiconductor element 106, and a method of wedge bonding, which is conventionally used as a bonding method of bonding a semiconductor element to an inner lead of a lead frame, can be adopted. Due to the above knowledge, the present inventors accomplished the present invention.

The present invention to accomplish the above first task provides an IC card comprising: a plane coil in which a conductor wire is wound a plurality of times in substantially the same plane, the plane coil being formed by punching or etching; and a semiconductor element having electrode terminals to which ends of the plane coil are electrically connected, wherein the plane coil includes an inside terminal formed inside the coil and an outside terminal formed outside the coil, the semiconductor element is arranged in such a manner that a face of the element on which the electrode terminals are formed is opposed to the conductor line of the plane coil, the respective electrode terminals of the semiconductor element connected to the inside terminal and the outside terminal of the plane coil are respectively located at positions adjacent to the inside terminal and the outside terminal of the plane coil, and the electrode terminals of the semiconductor element are electrically connected to the respective terminals of the plane coil located on the same side with respect to the inside and outside of the coil.

In order to accomplish the above second task, the present inventors arranged the semiconductor element 106 with respect to the plane coil 100 so that a plane of the semiconductor element 106 on the back side with respect to a plane on which the electrode terminals 108, 110 were formed could be located on the conductor line 101 side, and the electrode terminals 108, 110 of the semiconductor element 106 were respectively bonded to the terminals 101, 103 of the plane coil 100. The present inventors found the following. In this IC card, it is unnecessary to cover the wires, for insulation, which connect the plane coil 101 with the semiconductor element 106, and a method of wedge bonding, which is conventionally used as a bonding method of bonding the semiconductor element to an inner lead of a lead frame, can be adopted.

The present invention to accomplish the above second task provides an IC card comprising: a plane coil in which a conductor wire is wound a plurality of times in substantially the same plane; and a semiconductor element having electrode terminals to which ends of the plane coil are electrically connected, wherein the plane coil includes an inside terminal formed inside the coil and an outside terminal formed outside the coil, the semiconductor element is arranged in such a manner that a plane of the semiconductor element on the back side with respect to a plane on which the electrode terminals thereof are formed is opposed to the conductor line of the plane coil, the respective electrode terminals of the semiconductor element connected to the inside terminal and the outside terminal of the plane coil are respectively located at positions adjacent to the inside terminal and the outside terminal of the plane coil, and the electrode terminals of the semiconductor element are electrically connected to the terminals of the plane coil located on the same side with respect to the inside and outside of the plane coil.

In the present invention to accomplish the above second task, a plane coil in which a conductor line is wound a plurality of times in substantially the same plane is formed by punching or etching. In an IC card in which terminals of the plane coil and electrode terminals of the semiconductor element are electrically connected to each other, the plane coil includes an inside terminal formed inside the coil and an outside terminal formed outside the coil, and the semiconductor element is subjected to resin molding so that a connecting section formed at an end of a lead connected with the electrode terminal can be exposed, and the respective connecting sections of the leads connected to the inside terminal and the outside terminal of the plane coil are located inside and outside the coil, and the connecting sections of the leads are electrically connected to the terminals of the plane coil located in the same side with respect to the inside and the outside of the coil.

The present invention to accomplish the second task provides a frame for an IC card used for manufacturing the IC card having a plane coil in which a conductor line is wound a plurality of times in substantially the same plane, the plane coil being formed by punching or etching, terminals of the plane coil and electrode terminals of the semiconductor element being electrically connected to each other, wherein the plane coil includes an inside terminal formed inside the coil, to which the electrode terminal of the semiconductor element located on the same side with respect to the inside and the outside of the coil is electrically connected and the plane coil also includes an outside terminal formed outside the coil.

The phrase "in substantially the same plane" described in the present invention means that the conductor line is wound in the same plane as a whole even though irregularities are formed in a portion of the conductor line which composes the plane coil.

BRIEF DESCRIPTION OF THE DRAWINGS

FIG. 3 is a plan view for explaining a frame in which a plurality of plane coils are formed.

THE MOST PREFERRED EMBODIMENT

Figure 1:
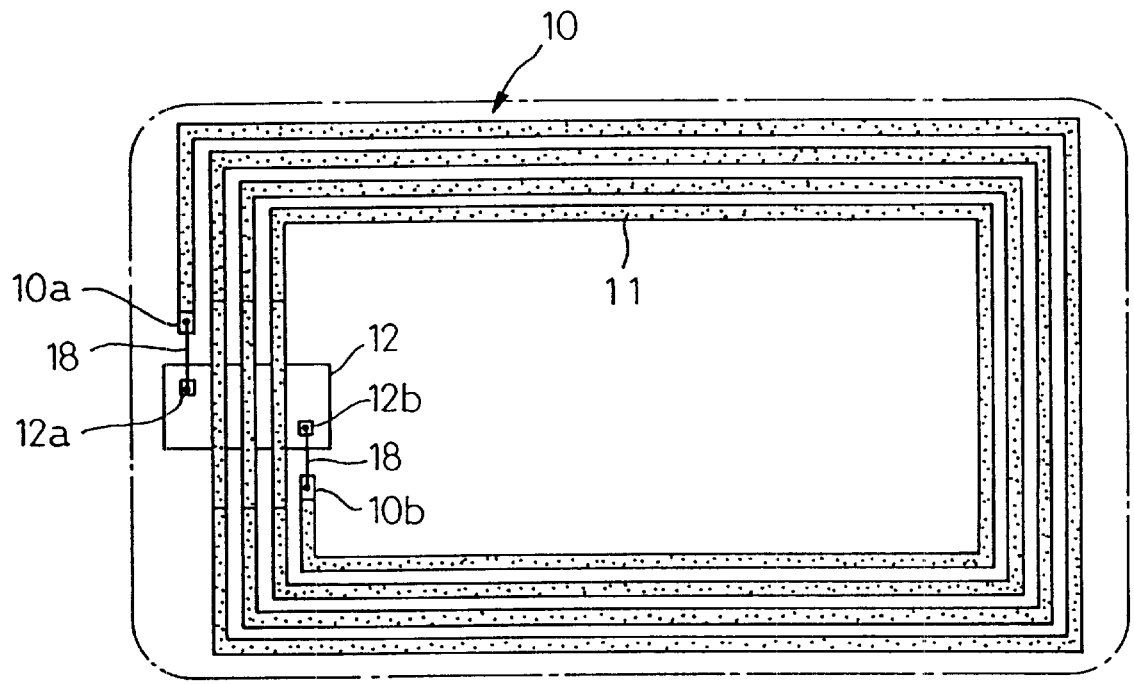
FIG. 1 is a plan view for explaining an example of the IC card according to the present invention.

FIG. 1 is a plan view showing an example of the IC card according to the present invention. As shown in FIG. 1, there is provided a rectangular plane coil 10 in which a conductor line 11, the thickness of which is not less than 80 $\mu$m, formed by punching, is wound a plurality of times in substantially the same plane. This plane coil 10 is composed in such a manner that the conductor line 11 is wound on the same plane, which is the same plane as a whole, a plurality of times. There are provided terminals 10a, 10b which are respectively arranged at end portions on the inside and the outside of the plane coil 10. Also, there are provided electrode terminals 12a, 12b, which are formed in a semiconductor element 12 of 40 to 50 $\mu$m thickness, respectively located on the inside and the outside of the plane coil 10. Concerning the terminals 10a, 10b and the electrode terminals 12a, 12b, the terminals formed on the same side with respect to the direction of the inside and outside are electrically connected with each other.

Figure 2:
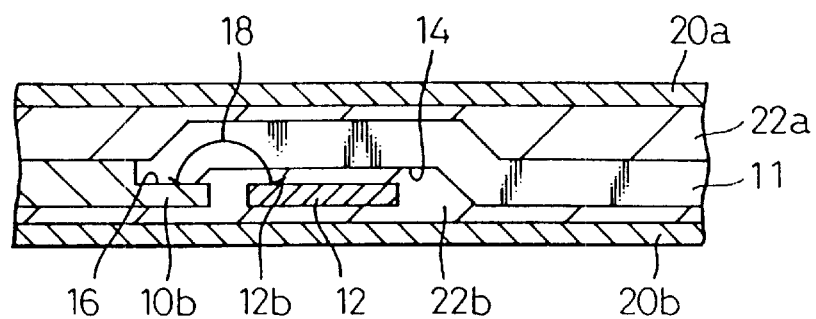
FIG. 2 is a partial cross-sectional view of the IC card shown in FIG. 1.

In the IC card shown in FIG. 1, in the plane coil 10 into which the semiconductor element 10 is incorporated, there is provided a recess 14 which is formed when the conductor line 11 composing the plane coil 10 is bent as shown in FIG. 2. In this recess 14, the semiconductor element 12 is arranged. The conductor line 11 can be bent as described above by punching. The recess 14 is preferably formed into a size so that the entire semiconductor element 12 can be inserted into the recess 14.

In this connection, in FIG. 1, the recess 14 is formed between the corners of the rectangular plane coil 10, however, the recess 14 may be formed at the corner of the plane coil 10 so that the semiconductor element 10 can be arranged in the recess 14.

As shown in FIG. 2 which is a partial cross-sectional view of the IC card shown in FIG. 1, in the terminals 10a, 10b of the plane coil 10 which are arranged while clearances are left between the terminals 10a, 10b and the semiconductor element 12, there are formed connecting faces 16 by means of squeezing so that the connecting faces 16 can be on substantially the same side as the face on which the electrode terminals 12a, 12b of the semiconductor element 12 are formed. Portions in which these connecting faces 16 are formed have the substantially same thickness as that of the semiconductor element 12 as shown in FIG. 2.

As described above, in the IC card shown in FIGS. 1 and 2, the connecting faces 16 of the terminals 10a, 10b of the plane coil 10 and the forming faces, on which the electrode terminals 12a, 12b of the semiconductor element 12 are formed, are substantially in the same plane. Therefore, it is possible to conduct wire-bonding by the method of wedge bonding or ball bonding. Therefore, as shown in FIG. 2, the terminals 10a, 10b of the plane coil 10 can be electrically connected to the electrode terminals 12a, 12b of the semiconductor element 12 by the wires 18, 18 made of gold, platinum or aluminum without protrusion of portions of the loops of the wires from the face of the plane coil 10.

As shown in FIG. 2, the plane coil 10, the semiconductor element 12 and other parts are enclosed and sealed by adhesive layers 22a, 22b made of polyurethane or polyolefin which are formed inside resin films 20a, 20b, which form a front face and a reverse face of the IC card, and letters are printed on surfaces of the resin films.

When the IC card shown in FIGS. 1 and 2 is manufactured, it is preferable to use frame F shown in FIG. 3 for the plane coil 10. This frame F is formed by punching a metal plate made of copper, iron or aluminum. In frame F, there are provided two rails 60, 60 which are parallel to each other, and plane coils 10, 10 . . . are arranged longitudinally between the two rails 60, 60. The plane coils 10, 10 . . . are composed of conductor lines 11, and the outermost conductor lines 11a are thicker than other conductor lines 11, and the conductor line 11a of the plane coil 10 is connected with the conductor line 11a of the adjacent plane coil 10 by the connecting section 62. Due to the above structure, it is possible to enhance the mechanical strength of the plane coil 10, and further it is possible to improve the handling property of frame F when it is transported.

In the plane coil 10 of frame F shown in FIG. 3, the outermost conductor line 11a is formed to be thick, however, an IC card may be formed under the condition that the conductor line 11a is thicker than the other conductor lines 11. Alternatively, when the connecting section 62 is cut off, the outermost conductor line 11a may be cut off so that the thickness of the conductor line 11a can be the same as that of other conductor lines 11.

In order to enhance the mechanical strength of the plane coil 10, the conductor lines 11 composing the plane coils 10 may be connected by the connecting sections. A short-circuit between the conductor lines 11 can be prevented when the connecting sections are cut before they are enclosed by the adhesive layers 22a, 22a formed inside the resin films 20a, 20b formed on the front face and the reverse face of the IC card.

In this connection, a frame F shown in FIG. 3 can also be manufactured by conducting etching on a metallic plate made of metal such as copper, iron or aluminum or a metallic plate made of alloy of these metals. It is possible for frame F, which has been manufactured by etching, to form a plane coil 10 composed of a conductor line 11 which is thinner than a conductor line 11 of a plane coil formed by punching.

When an IC card is manufactured from the frame F shown in FIG. 3, the semiconductor element 12 may be incorporated into the plane coil 10 separated from the frame F, however, it is preferable that the semiconductor element 12 is incorporated into the plane coil 10 without separating the plane coil 10 from the frame F. In this case, the semiconductor element 12 is incorporated into each plane coil 10 formed in frame F, and the terminals 10a, 10b of the plane coil 10 and the electrode terminals 12a, 12b of the semiconductor element 12 are bonded to each other by the wires 18, 18.

Next, the plane coil 10 and the semiconductor element 12 are enclosed by the resin films 20a, 20b, on one side of which the adhesive layers 22a, 22b are formed. After that, a predetermined position is cut so that the plane coil 10 can be separated from the frame F. In this way, the IC card can be obtained.

Concerning the method of bonding in which the wires are used, the wedge bonding method is preferably used because the swells (the sizes of loops of wires) of the wires 18, 18 can be reduced to as small as possible by the wedge bonding method. This wedge bonding method can be realized when the wedge bonding device shown in FIG. 4 is used. This wedge bonding device is commonly used as a device for manufacturing semiconductors.

Figure 4A:
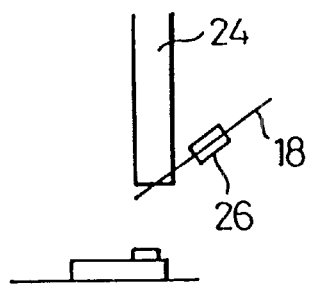
FIGS. 4(a) to 4(e) are schematic illustration for explaining the wedge bonding method.
Figure 4D:
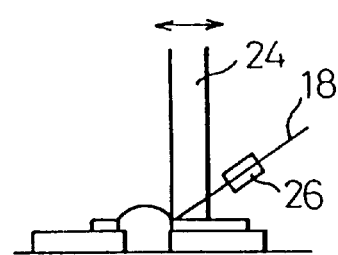
Figure 4B:
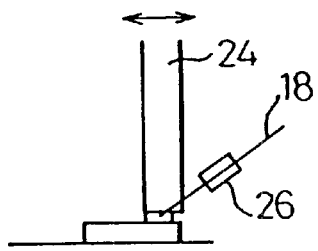

In the bonding work conducted by the above wedge bonding device, a wedge 24 is moved to a position above one of the terminals to be bonded (this terminal to be bonded is referred to as a bonding terminal, hereinafter). A forward end of the wire 18 held by a clamper 26 is obliquely inserted into a forward end portion of this wedge 24 as shown in FIG. 4(a). This wedge 24 is lowered and conducts contact-bonding the forward end of the wire 18 onto the connecting face with pressure as shown in FIG. 4(b).

Figure 4E:
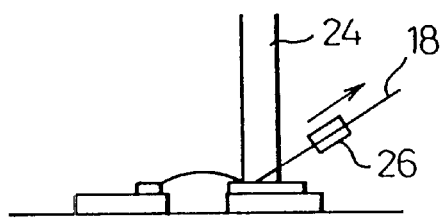
Figure 4C:
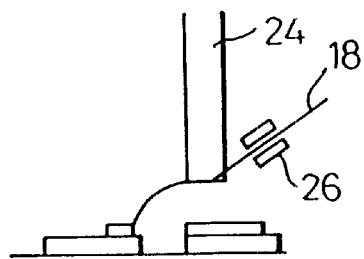

Next, while the wedge 24 is being moved in a direction of the other bonding terminal which is formed on the substantially same plane as the plane of one bonding terminal, the clamper 26 is opened, so that the wire 18 is guided to the other bonding terminal as shown in FIG. 4(c). After that, the forward end of the wire 18 is contact-bonded onto the connecting face of the other bonding terminal with pressure as shown in FIG. 4(d).

After that, the wire 18 is held and drawn by the clamper 26. After that, the wire 18 is cut off as shown in FIG. 4(e). In this way, the operation of bonding is completed.

When a series of operation shown in FIGS. 4(a) to 4(e) is repeated, the operation of bonding can be successively carried out.

According to the above wedge bonding method, the forward end portion of the wire 18 held by the clamper 26 is obliquely inserted into the forward end portion of the wedge 24 as shown in FIG. 4. Accordingly, when the wire 18, the forward end portion of which is contact-bonded to one of the bonding terminals, is guided to the other bonding terminal, it is possible to reduce the swell (the size of a loop) of the wire 18 to as small as possible.

Due to the foregoing, as shown in FIG. 2, the terminals 10a, 10b of the plane coil 10 and the electrode terminals 12a, 12b of the semiconductor element 12 can be electrically connected with each other by the wires 18, 18 without protrusion of a portion of a loop from the face of the plane coil 10.

In the loop-shaped wire 18 shown in FIG. 2, the following problems may be encountered. When the plane coil 10, the semiconductor element 12 and others are enclosed by the resin films 20a, 20b, on one side of which the adhesive layers 22a, 22b are formed, the loop-shaped portion of the wire 18 is deformed in a flowing direction of adhesive, and the contact-bonded section of the wire 18 is peeled off, and further the wire 18 is cut off. Due to the foregoing, there is a possibility that the wire 18 comes into contact with the conductor line 11 of the plane coil 10. In order to prevent the deformation and others of the loop-shaped wire 18, it is preferable that the contact-bonded section of the wire 18, which is contact-bonded to the terminal 10b of the plane coil 10 and the electrode terminal 12b of the semiconductor element 12, is fixed by resin 15, 15, especially by resin hardened by ultraviolet rays.

In this connection, bonding of the wire 18 is not limited to the above wedge bonding method, but it is possible to adopt a ball bonding method.

In the IC card shown in FIGS. 1 and 2, in order to electrically connect the terminals 10a, 10b of the plane coil 10 with the electrode terminals 12a, 12b of the semiconductor element 12, bonding is conducted by the wires 18, 18. The thickness of the semiconductor element 12 is 40 to 50 μm, that is, weight of the semiconductor element 12 is small. Therefore, the semiconductor element 12 can be sufficiently supported by the wires 18, 18.

Figure 6:
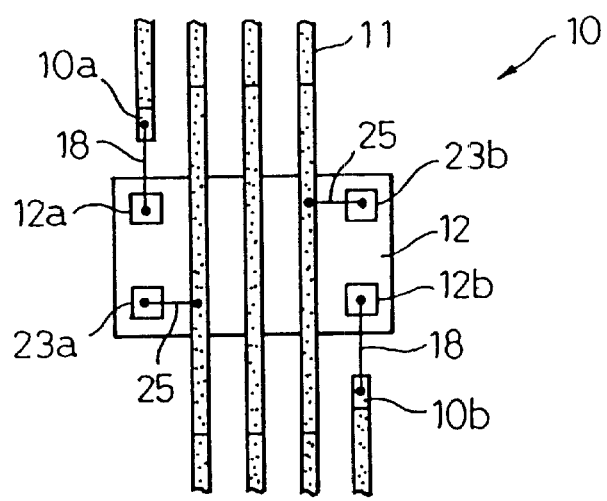
FIG. 6 is a partial plan view for explaining another example of the IC card according to the present invention.

In the case where the semiconductor element 12 cannot be supported only by the above wires 18, 18 and problems are caused in the manufacturing process, support wires 25, 25 for supporting the semiconductor element 12 may be provided between the conductor lines 11 and pads 23a, 23b as shown in FIG. 6. In this case, the pads 23a, 23b for supporting the supporting wires 25, 25 are provided at positions outside and inside the plane coil 10 on a face on which the electrode terminals 12a, 12b of the semiconductor element 12 are formed.

In this connection, in the structure shown in FIG. 6, there are provided two supporting wires 25. However, as long as the semiconductor element 12 can be sufficiently supported by one supporting wire 25, one supporting wire 25 may be provided.

Figure 7:
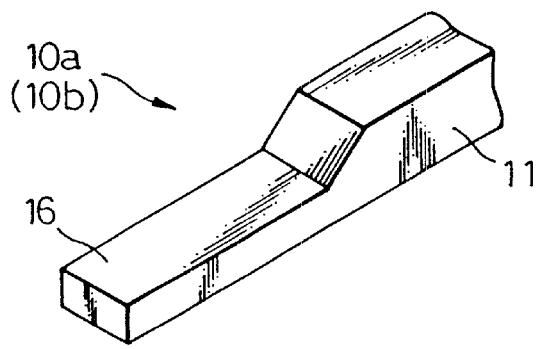
FIG. 7 is a partial perspective view for explaining a terminal of a plane coil composing the IC card shown in FIGS. 1, 2, 5 and 6.

The connecting face 16 of the terminals 10a, 10b of the plane coil 10 shown in FIGS. 1 to 6 may be substantially the same face, being subjected to squeezing, as the face on which the electrode terminals 12a, 12b of the semiconductor element 12 are formed, and the configuration of the connecting face 16 may be arbitrarily determined. However, it is preferable that the configuration of the terminals 10a, 10b of the plane coil 10 shown in FIGS. 1, 2 and 6 is formed into the configuration shown in FIG. 7. The connecting face 16 of the terminal 10a 10(b) shown in FIG. 7 is formed by means of squeezing and is extended under the condition that its width is kept at the width of the conductor line 11. Therefore, it is possible to sufficiently ensure a portion in which the connecting face 16 is connected with the terminal of the wire 18 arranged in substantially parallel to the conductor line 11.

Figure 8:
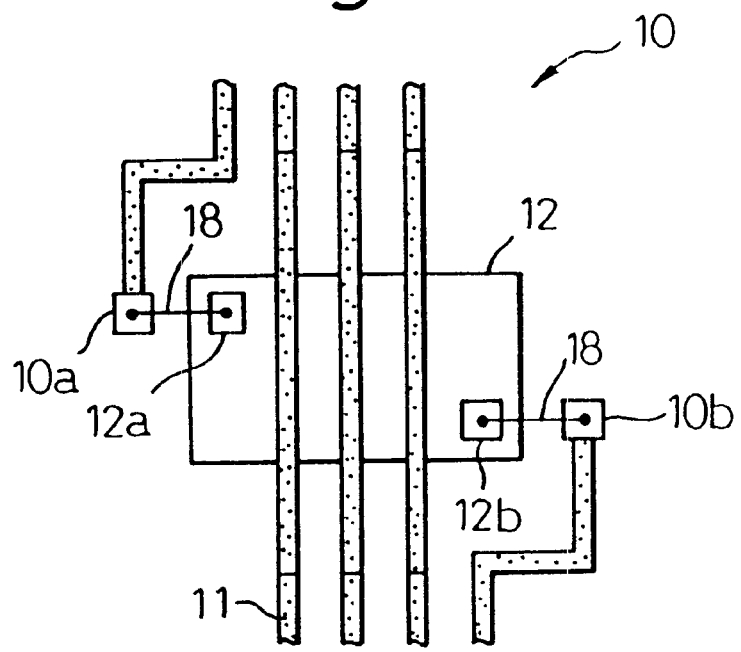
FIG. 8 is a partial plan view for explaining another example of the IC card according to the present invention.

The terminals 10a, 10b of the plane coil 10 may be connected with the electrode terminals 12a, 12b of the semiconductor element 12 as follows. The terminals 10a, 10b of the plane coil 10 are separate from the semiconductor element 12 and arranged at positions close to the electrode terminals 12a, 12b located inside and outside the plane coil 10, and the thus arranged terminals 10a, 10b of the plane coil 10 are connected with the electrode terminals 12a, 12b. FIG. 8 is a view showing a case in which the wires 18, 18 connecting the terminals 10a, 10b with the electrode terminals 12a, 12b are stretched in a direction perpendicular to the conductor line 11.

Figure 9:
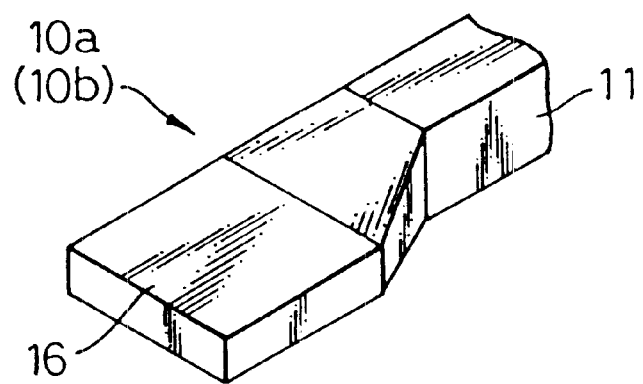
FIG. 9 is a partial perspective view for explaining a terminal of a plane coil composing the IC card shown in FIG. 8.

It is preferable that the terminals 10a, 10b of the plane coil 10 shown in FIG. 8 are formed into the configuration shown in FIG. 9. The width of the connecting face 16, which has been subjected to squeezing, of the terminal 10a (10b) shown in FIG. 9 is extended in such a manner that the width of the connecting face 16 is larger than that of the conductor line 11. Therefore, the connecting face 16 is sufficiently large when it is connected with an end of the wire 18 stretched in a direction perpendicular to the conductor line 11.

Figure 10:
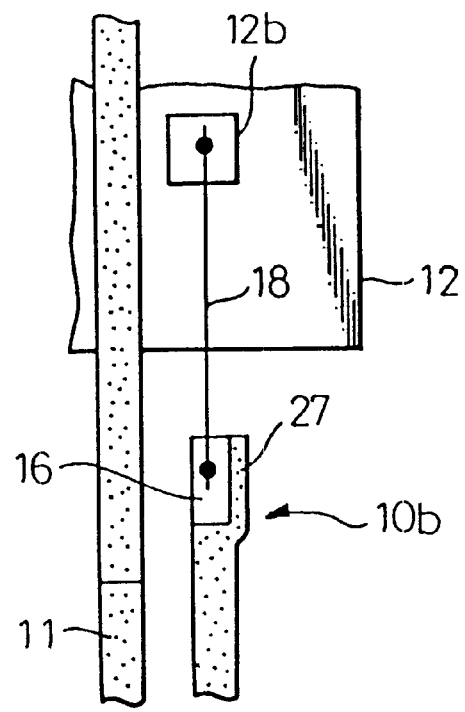
FIG. 10 is a partial plan view for explaining another example of the IC card according to the present invention.

Concerning the loop-shaped wire 18 shown in FIG. 2, there is a possibility that the wire 18 is deformed in a direction of flow of adhesive when the wire 18 is enclosed and sealed by the adhesive layers 22a, 22b formed on one side of the resin films 20a, 20b. Especially, there is a possibility that the deformed wire 18 comes into contact with the conductor line 11 when a clearance between the wire 18 and the conductor line 11 composing the plane coil 10 is small. In order to solve the above problems, it is preferable that a wall section 27 is formed in a portion of the connecting face 16 on the opposite side to the conductor line 11 in the terminals 10a, 10b located inside and outside the plane coil 10 as shown in FIG. 10. By this wall section 27, it is possible to reduce a flow of adhesive in portions close to the terminals 10a, 10b when the wire 18 is enclosed by the adhesive layers 22a, 22b. Therefore, it is possible to prevent the wire 18 from coming into contact with the conductor wire 11 and being deformed.

Figure 11:
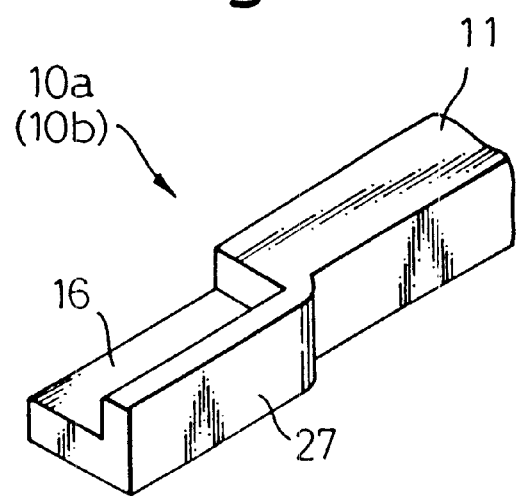
FIG. 11 is a partial perspective view for explaining a terminal of a plane coil composing the IC card shown in FIG. 10.

It is preferable that the terminals 10a, 10b of the plane coil 10 shown in FIG. 10 are formed into the configuration shown in FIG. 11. In the terminals 10a, 10b shown in FIG. 11, there is formed a connecting face 16 which is subjected to squeezing so that the end portion of the conductor wire 11 can be extended under the condition that the width of the conductor wire 11 is kept, and a wall portion 27 is vertically provided in a portion on the opposite side to the conductor line 11.

Figure 12:
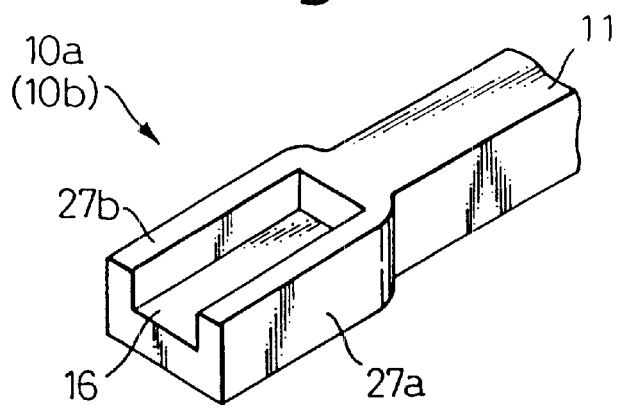
FIG. 12 is a partial perspective view for explaining another example of the plane coil shown in FIG. 11.

It is possible to use terminals 10a, 10b shown in FIG. 12 instead of the terminals 10a, 10b of the plane coil 10 shown in FIG. 11. In the terminals 10a, 10b shown in FIG. 11, there is formed a connecting face 16 which is subjected to squeezing so that the end portion of the conductor line 11 can be extended under the condition that the width of the conductor line 11 is kept, and further wall portions 27a, 27b are formed on both sides of the connecting face 16. According to the terminals 10a, 10b shown in FIG. 12, it is possible to ensure a sufficiently large connecting face 16 to be connected with the end portion of the wire 18 stretched substantially in parallel with the conductor line 11, and it is possible to reduce a flow of adhesive in portions close to the terminals 10a, 10b when the wire 18 is enclosed by the adhesive layers 22a, 22b. Therefore, it is possible to prevent the wire 18 from coming into contact with the conductor wire 11 and being deformed. Even when the wire 18 is deformed onto the conductor line 11 side, it is possible to prevent the wire 18 from coming into contact with the conductor line 11 by the wall portion formed on the conductor line 11 side.

Any terminal 10a (10b) shown in FIGS. 7, 9, 11 and 12 can be formed by squeezing the end portion of the conductor line 11 composing the plane coil 10. Since the terminals 10a, 10b, which are formed by means of squeezing, are bonded by the wire 18, in order to positively connect the terminals 10a, 10b with the wire 10, the connecting faces 16 of the terminals 10a, 10b are preferably subjected to gold or palladium plating.

Figure 13:
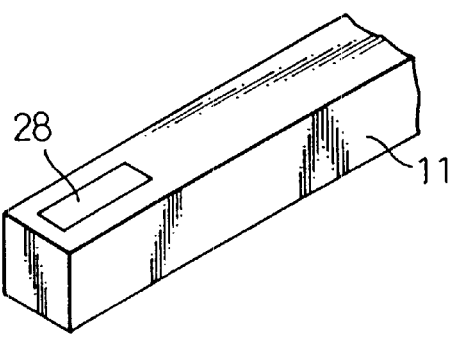
FIG. 13 is a partial perspective view for explaining an end portion of the conductor line 11 before the formation of the terminal of the plane coil composing the IC card shown in FIGS. 7, 9, 11 and 12.

However, since the configurations of the terminals 10a, 10b are complicated, it is difficult to conduct gold or palladium plating only on the connecting faces 16. Therefore, it is preferable that gold or palladium plating is previously conducted in a portion of the end of the conductor line 11 which is subjected to squeezing as shown in FIG. 13. A layer of gold or palladium which has been previously provided by means of plating can substantially cover the connecting faces 16 of the extended terminals 10a, 10b in the process of squeezing.

In the IC card described above, the terminals 10a, 10b of the plane coil 10 and the electrode terminals 12a, 12b of the semiconductor element 12 are connected the wires 18, 18 made of gold, platinum or aluminum, the electric conductivity of which is high. However, since the wires 18, 18 are thin, the electric resistance of the wires 18, 18 is higher than that of the conductor line 11 composing the plane coil 10. Accordingly, a problem may be caused in which electric power generated in the plane coil 10 by electromagnetic induction is not sufficiently transmitted to the semiconductor element 12.

Figure 14:
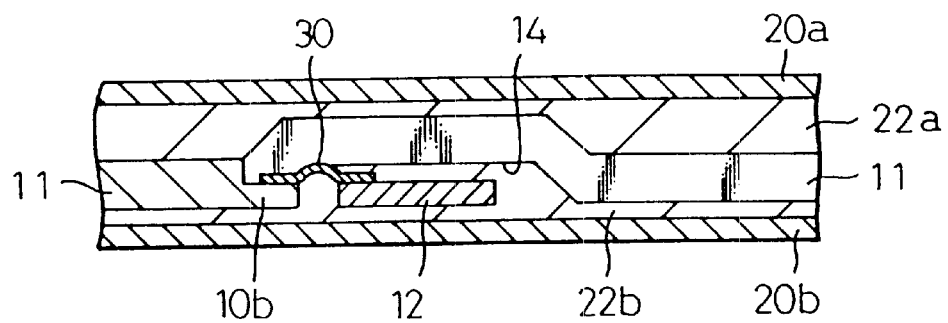
FIG. 14 is a partial cross-sectional view for explaining another example of the IC card according to the present invention.

In order to solve the above problem, it is preferable that the terminals 10a, 10b of the plane coil 10 and the electrode terminals 12a, 12b of the semiconductor element 12 are connected by ribbon-shaped connecting metallic members 30 as shown in FIG. 14.

Figure 15:
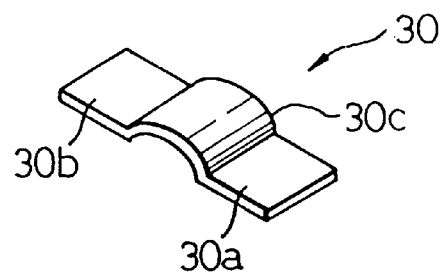
FIG. 15 is a perspective view for explaining a configuration of the connecting metal member 30 shown in FIG. 14.

The width of this ribbon-shaped connecting metallic member 30 is approximately the same as that of the conductor line 11, and this ribbon-shaped connecting metallic member 30 is made of a metal such as copper, gold or aluminum, the electric conductivity of which is high. This connecting metallic member 30 may be a flat sheet, however, it is preferable to use a sheet, the middle portion of which is formed into a dome-shape as shown in FIG. 15. The reason is that stress generated in the plane coil 10 by a difference of the coefficient of thermal expansion between the plane coil 10 and the semiconductor element 12 can be absorbed by this connecting metallic member 30, the middle portion of which is formed into a dome-shape, and further, stress generated in the plane coil 10 when the IC card is bent can be also absorbed by this connecting metallic member 30. Both end portions 30a, 30b of this connecting metallic member 30 shown in FIG. 15 are formed flat and respectively connected with the terminal 10a (10b) of the plane coil 10 and the electrode terminal 12a (12b) of the semiconductor element 12.

In this case, when the connecting metallic member 30 is made of copper, connection of both terminals is made as follows. The connecting face of the connecting metallic member 30 is plated with gold, tin or solder, and the electrode terminals 12a, 12b of the semiconductor element 12 and the terminals 10a, 10b of the plane coil 10 are plated with gold, and both terminals to be connected are heated and contact-bonded, so that they are connected with each other by the thus formed eutectic alloy. On the other hand, in the case where the connecting metallic member 30 is made of gold or aluminum, both terminals can be connected with each other without conducting metal plating on the connecting face of the connecting metal member 30. It is also possible to connect both terminals with each other by using an electrically conductive adhesive.

In this connection, of course, it is necessary to form the dome-shaped portion 30c into an appropriate size so that it cannot protrude from the plane coil 10.

Figure 16:
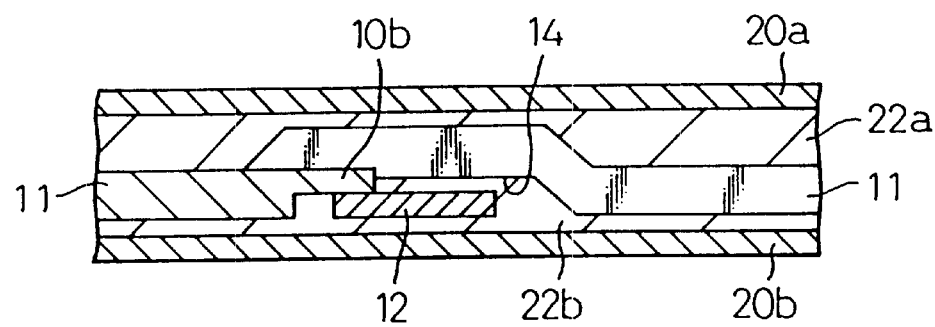
FIG. 16 is a partial cross sectional view for explaining another example of the IC card according to the present invention.

In order to reduce a value of electric resistance of the connecting section between the terminals 10a, 10b of the plane coil 10 and the electrode terminals 12a, 12b of the semiconductor element 12, the terminal 10b (10a) and the electrode terminal 12b (12a) may be directly joined to each other as shown in FIG. 16. The aforementioned joining can be accomplished as follows. The electrode terminals 12a, 12b of the semiconductor element 12 are plated with gold, and the terminals 10a, 10b of the plane coil 10 are plated with metal such as gold, tin or solder. They are heated and pressed, so that they can be joined to each other by forming an eutectic alloy between them. Also, both terminals can be connected with each other by using an electrically conductive adhesive.

Figure 17:
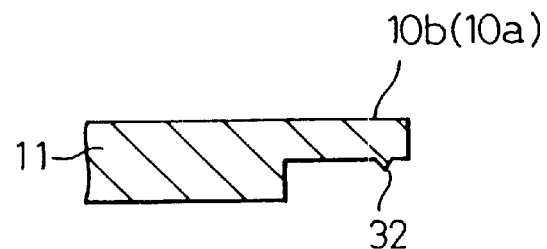
FIG. 17 is a partial cross-sectional view for explaining a configuration of the terminal 10b (10a) of the plane coil shown in FIG. 16.

In this case, in order to positively connect the terminals 10b (10a) with the electrode terminal 12b (12a), it is preferable that a protrusion 32, which is squeezed when it comes into contact with the electrode terminal 12b (12a) of the semiconductor element 12, is formed on the contacting face of the terminal 10b (10a) as shown in FIG. 17.

In the case where the electrode terminals 12b, 12a of the semiconductor element 12 and terminals 10a, 10b of the plane coil 10 are directly joined to each other as shown in FIG. 16, stress generated in the plane coil 10 concentrates at the connecting sections of both terminals by the influence of bending and heating on the IC card, and both terminals are separated from each other. In order to reduce the concentration of stress upon the connecting sections of both terminals, it is preferable to provide stress absorbing sections for absorbing stress given to the plane coil 10 at positions close to the terminals 10a, 10b of the plane coil 10.

Figure 18:
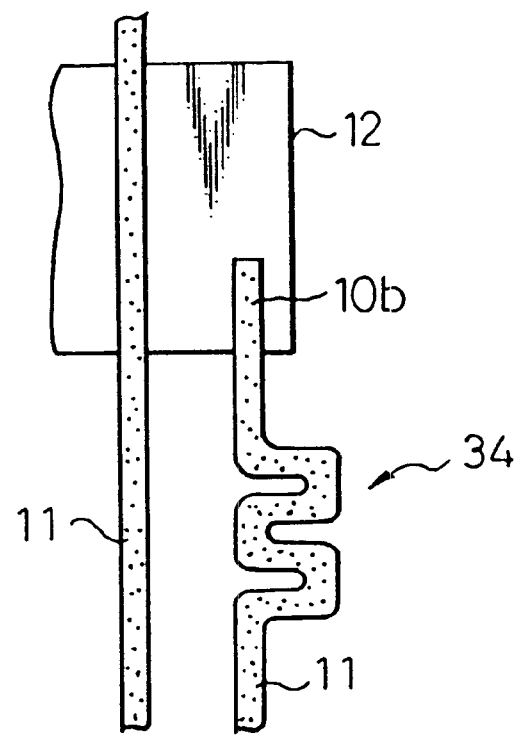
FIG. 18 is a partial plan view for explaining another example of the IC card according to the present invention.

Concerning the aforementioned stress absorbing section, it is preferable to provide the bend section 34 shown in FIG. 18 for the stress absorbing section, because it is easy to form the bent section 34 by punching. When this bent section 34 is provided, it is possible to absorb stress given to the plane coil 10 by the extension and contraction of the bend section 34. Therefore, stress on the connecting sections of both terminals can be reduced.

Figure 19:
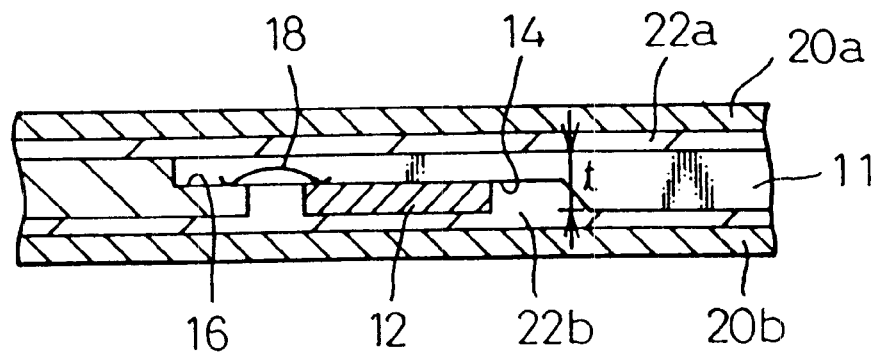
FIG. 19 is a partial cross-sectional view for explaining another example of the IC card according to the present invention.

The recess 14 formed in the plane coil 10 is made when the conductor line 11 is bent. Further, the recess 14 may be formed in the plane coil 10 in such a manner that a middle portion of the conductor line 11 is squeezed because the thickness of the conductor line 11 is larger that that of the semiconductor element 12 so that the recess 14 can be formed as shown in FIG. 19. In this case, the plane coil 10 and the semiconductor element 12 can be located at the center of the IC card in the thickness direction. Therefore, the IC card can be made thin. In this connection, in this case, the semiconductor element 12 and the wire 18 are housed in a range of thickness t of the conductor line 11.

In this connection, a portion of the conductor line 11 which has been squeezed becomes thinner than other portions of the conductor line 11 as shown in FIG. 19, however, no problems are caused in the electric resistance of the conductor line 11 itself.

In the IC card described above, the recess 14 is formed by bending or squeezing the conductor line 11 composing the plane coil 10. However, as shown in FIGS. 20 and 21, when a portion close to the end of the conductor line 11 is bent in the direction of thickness of the IC card and the end portion is subjected to squeezing, the respective connecting faces 16 of the terminals 10a, 10b of the plane coil 10 can be made to be in substantially the same plane as the plane including the forming face on which the electrode terminals 12a, 12b of the semiconductor element 12 are formed, without forming the recess 14 in the plane coil 10.

Figure 20:
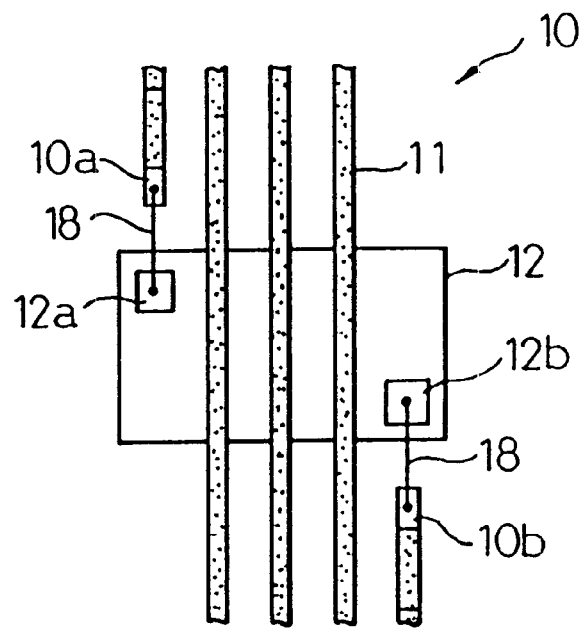
FIG. 20 is a partial plan view for explaining another example of the IC card according to the present invention.
Figure 21:
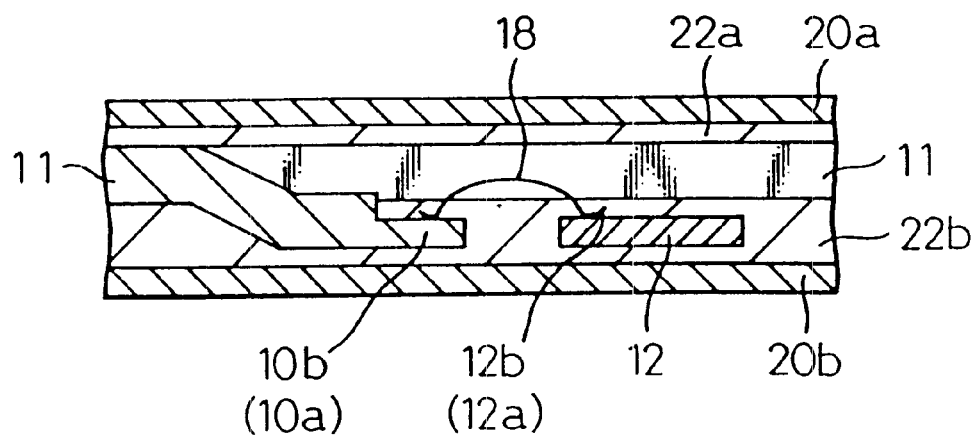
FIG. 21 is a partial cross-sectional view for explaining the IC card shown in FIG. 20.
Figure 22:
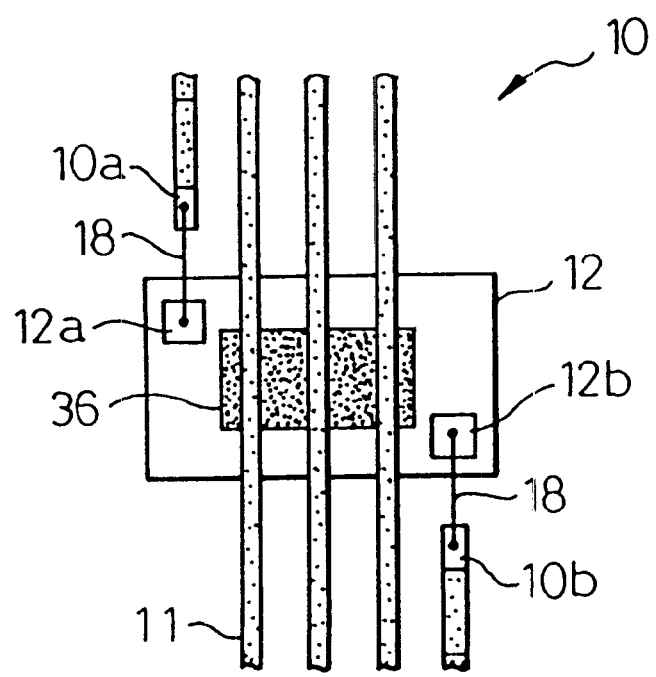
FIG. 22 is a partial plan view for explaining another example of the IC card according to the present invention.
Figure 23:
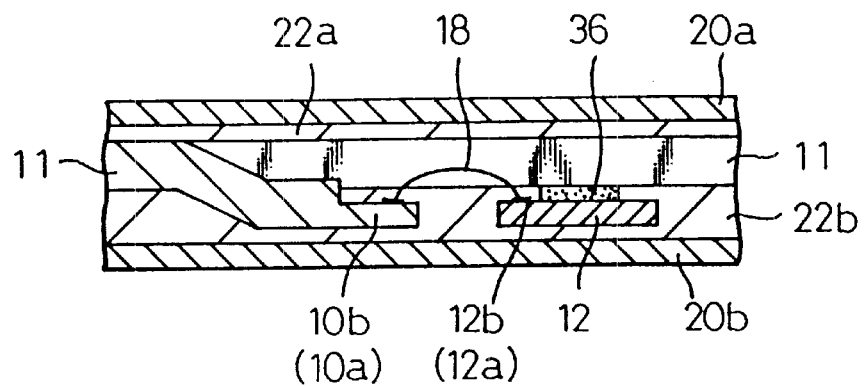
FIG. 23 is a partial cross-sectional view for explaining the IC card shown in FIG. 22.

In FIGS. 20 and 21, when the terminals 10a, 10b of the plane coil 10 and the electrode terminals 12a, 12b of the semiconductor element 12 are bonded to each other by the wires 18, 18, the conductor line 11 of the plane coil 10, which passes through an upper face of the semiconductor element 12, is not made to adhere to the semiconductor element 12. However, it is preferable to adopt the following procedure. As shown in FIGS. 22 and 23, after the conductor line 11 of the plane coil 10 passing through an upper face of the semiconductor element 12 has been made to adhere to the semiconductor element 12 by the adhesive layer 36, the terminals 10a, 10b of the plane coil 10 and the electrode terminals 12a, 12b of the semiconductor element 12 are bonded to each other by wires. When the conductor line 11 of the plane coil 10 is made to adhere to the semiconductor element 12 by the adhesive layer 36, positioning can be easily carried out in the process of bonding.

In this connection, even in the case shown in FIGS. 1 to 19, it is preferable to adopt the following procedure. After the conductor line 11 of the plane coil 10 has been made to adhere to the semiconductor 12 by the adhesive layer 36, the terminals 10a, 10b of the plane coil 10 and the electrode terminals 12a, 12b of the semiconductor element 12 are connected with each other.

Figure 24:
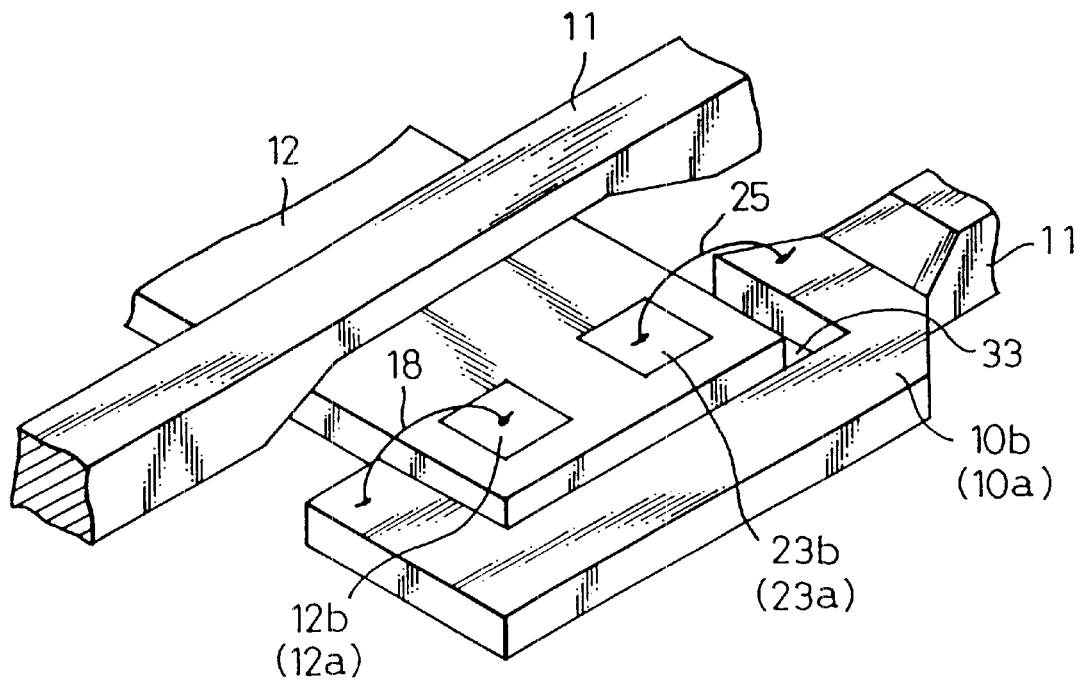
FIG. 24 is a partial perspective view for explaining another example of the IC card according to the present invention.

In the structure shown in FIG. 6, in order to support the semiconductor element 12, the supporting wire 25 is stretched between the semiconductor element 12 and the conductor line 11 of the plane coil 10. However, in the case of the conductor line 11, the width of which is narrow, it becomes difficult to joint one end of the supporting wire 25 to the conductor line 11. In this case, the following procedure is preferably adopted. As shown in FIG. 24, the connecting face of the terminal 10b (10a) of the plane coil 10, which has been subjected to squeezing, is extended, and the wire 18 connected with the electrode terminal 12b (12a) of the semiconductor element 12 and the supporting wire 25 connected with the supporting pad 23b (23a) are joined to the terminal 10b (10a) of the plane coil 10. In this terminal 10b (10a) of the plane coil 10, there is provided a C-shaped recess 33 into which an end portion having the electrode terminal 12b (12a) of the semiconductor element 12 and also having the pad 23b (23a) for the supporting wire is inserted. When the end portion of the semiconductor element 12 is inserted into this recess 33, the terminal 10b (10a) of the plane coil 10 is extended along the end edge of the end portion of the semiconductor element 12 in such a manner that the terminals 10b (10a) surrounds the end portion of the semiconductor element 12 having the electrode terminal 12b (12a) connected with the terminal 10b (10a) of the plane coil 10. Due to the foregoing, the semiconductor element 12 can be easily positioned, and further the lengths of the wire 18 and the supporting wire 25 can be reduced. Also, in this case, it is preferable that the wire 18 and the supporting wire 25 are bonded to each other after the semiconductor element 12 and the conductor line 11 of the plane coil 10 have been made to adhere to each other by the adhesive layer 36 shown in FIGS. 22 and 23.

Further, when the wire 18 and the supporting wire 25 are stretched in a straight line in parallel with the conductor line 11 as shown in FIG. 24, both wires can be easily bonded and the semiconductor element 12 can be supported maintaining a good balance.

Figure 25:
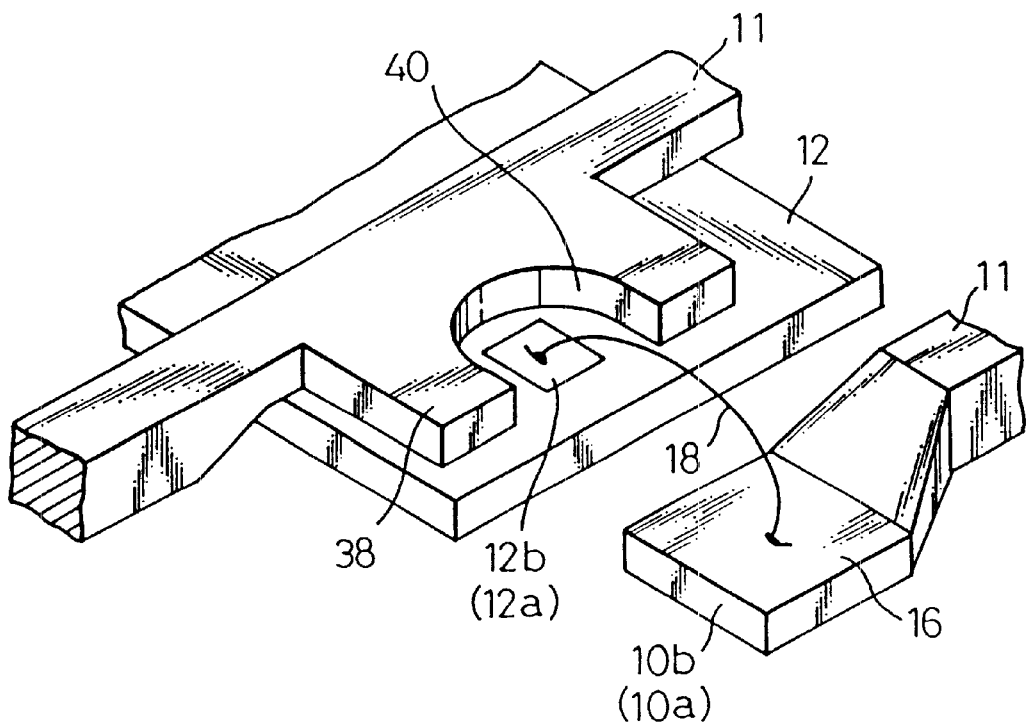
FIG. 25 is a partial perspective view for explaining another example of the IC card according to the present invention.

In the structure shown in FIG. 10, there is provided a wall section 27 on the side of the terminals 10a, 10b of the plane coil 10. By this wall section 27, it is possible to reduce a flow of adhesive in portions close to the terminals 10a, 10b of the plane coil 10 when the wire 18 is enclosed by the adhesive layers 22a, 22b. Therefore, it is possible to prevent the wire 18 from being deformed. On the other hand, in order to prevent the deformation of the wire 18 by reducing a flow of adhesive in a portion close to the electrode terminal 12b (12a) of the semiconductor element 12, it is preferable that a U-shaped portion 40, inside which the electrode terminal 12b (12a) of the semiconductor element 12 is located, is formed in an extending section 38 arranged in the middle of the conductor line 11 which passes through an upper face of the semiconductor element 12 as shown in FIG. 25. When the wire 18 is protected by forming the extending section 38, the terminal 10b (10a) shown in FIG. 9 is preferably used as the terminal 10b (10a) of the plane coil 10. In this terminal 10b (10a), the width of the connecting face 16, which has been formed by means of squeezing, is wider than that of the conductor line 11. Therefore, the connecting face 16 is sufficiently large when it is connected with an end portion of the wire 18 stretched in a direction perpendicular to the conductor line 11.

Figure 5:
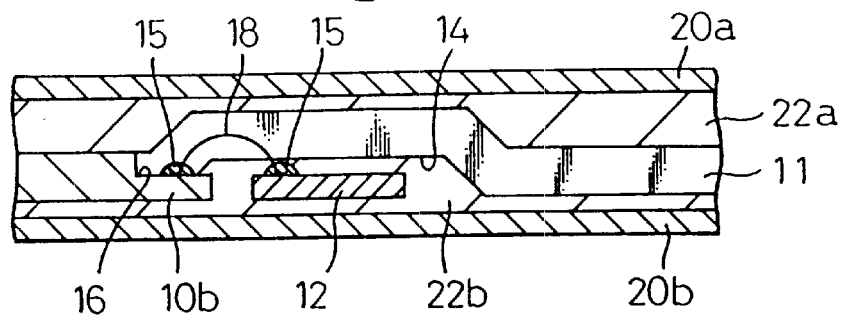
FIG. 5 is a partial cross-sectional view for explaining another example of the IC card according to the present invention.

Even in the case shown in FIG. 25, it is preferable that the contact-bonding sections between the terminal 10b of the plane coil 10 and the electrode terminal 12b of the semiconductor element 12 are fixed by resin 15, 15 as shown in FIG. 5, especially by resin hardened by ultraviolet rays, because the deformation of the wire 18 can be further prevented when the contact-bonding sections are fixed by resin.

Even in the structure shown in FIG. 25, it is preferable that the semiconductor element 12 and the conductor line 11 of the plane coil 10 are made to adhere to each other by the adhesive layer 36 and then the wire 18 is bonded.

Figure 26:
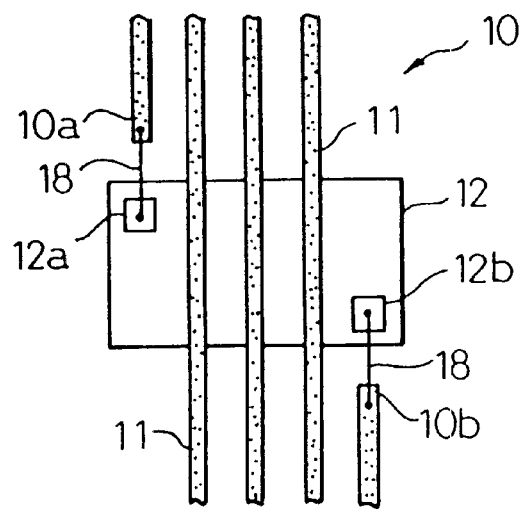
FIG. 26 is a partial plan view for explaining another example of the IC card according to the present invention.

In the above IC card, the conductive line 11 forming the plane coil 10 is thicker than the semiconductor element 12. However, when the thickness of the semiconductor element 12 is substantially the same as that of the conductor line 11, it is possible to use the IC card shown in FIG. 26 in which the semiconductor element 10 is arranged so that the forming faces of the electrode terminals 12a, 12b can be located on the conductor line 11 side with respect to the plane coil 10, and the electrode terminals 12a, 12b of the semiconductor element 12 are respectively connected with the terminals 10a, 10b of the semiconductor coil 10 by the wires 18, 18 without squeezing the terminals 10a, 10b. In this case, a portion of the loop of each wire 18, 18 sometimes protrudes from the conductor line 11, however, the quantity of protrusion is small. Therefore, the wires 18, 18 can be sufficiently sealed by the adhesive layers 22a, 22b formed on one side of the resin films 22a, 20b, and the deformation caused in the process of sealing is so small that no problems are caused.

Figure 27:
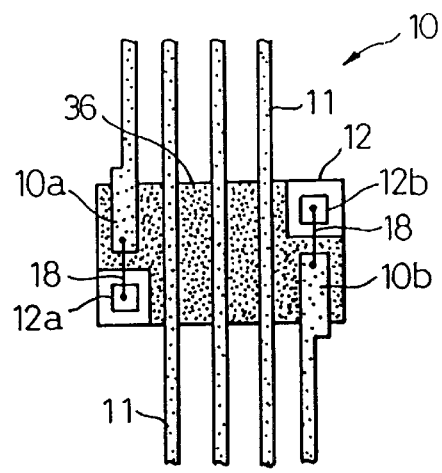
FIG. 27 is a partial plan view for explaining another example of the IC card according to the present invention.
Figure 28:
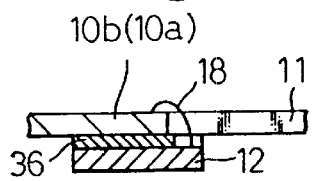
FIG. 28 is a partial cross-sectional view for explaining the IC card shown in FIG. 27.

In order to reduce the loops of the wires 18, 18 to as small as possible and also in order to make the bonding work of the wires easy, it is preferable to adopt the structure shown in FIG. 27 in which the terminals 10a, 10b of the plane coil 10, the widths of which are wider than the width of the conductor line 11, are made to adhere to portions close to the electrode terminals 12a, 12b of the semiconductor element 12 by the adhesive layer 36, and then the terminals 10a, 10b are respectively connected with the electrode terminals 12a, 12b by the wires 18, 18. As shown in FIG. 28, the loop formed by this wire 18 is smaller than the loop formed by the wire 18 shown in FIG. 26. Therefore, the adhesive layers 22a, 22b formed on one side of the resin films 20a, 20b for sealing the wires 18 can be made thin.

In order to absorb stress given to the plane coil 10 and prevent both terminals, which are joined, from being separated when the terminals 10a, 10b of the plane coil 10 are made to adhere to the semiconductor element 12 by the adhesive layers 23, a stress absorbing section such as the bend section 34 shown in FIG. 18 may be formed in the conductor line 11 close to the terminals 10a, 10b of the plane coil 10.

In this connection, of course, the semiconductor element 12 may be made to adhere to the conductor line 11 of the plane coil passing through the forming face of the electrode terminals 12a, 12b of the semiconductor element 12 via the adhesive layer 36.

Differences between the IC card shown in FIG. 29 and that shown in FIG. 1 will be explained as follows.

Concerning the semiconductor element 12 arranged in the recess 14 shown in FIG. 30, a plane on the reverse side with respect to the forming face of the electrode terminals 12a, 12b is put on the conductor line 11 which forms a bottom face of the recess 14. This semiconductor element 12 may be simply put on the conductor line 11, however, when this semiconductor element 12 is made to adhere onto the conductor line 11 by adhesive, positioning of the electrode terminals 12a, 12b of the semiconductor element 12 can be easily carried out.

Figure 30A:
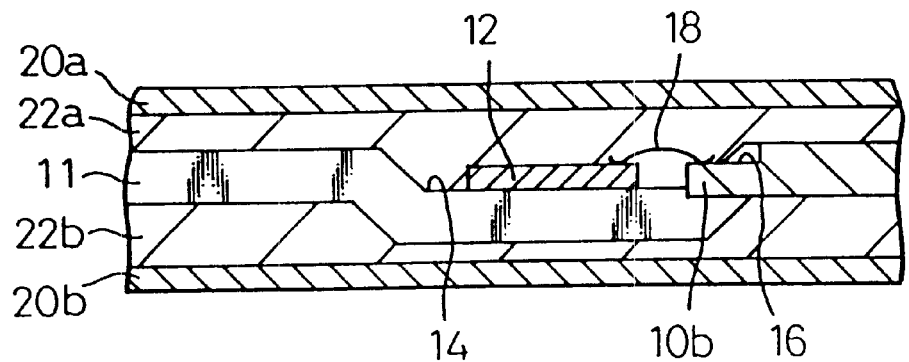
FIGS. 30(a) and 30(b) are partial cross-sectional views for explaining the IC card shown in FIG. 29.

FIG. 30(a) is a view showing an example in which the recess 14, the depth of which is larger than the thickness of the semiconductor element 12, is formed in the conductor line 11 of the plane coil 10. In this example, in order to make the connecting face 16 of the terminal 10b (10a) of the plane coil 10 to be substantially the same plane as the forming face of the electrode elements 12a, 12b of the semiconductor element 12, the terminal 10b (10a) of the plane coil 10 is subjected to squeezing. When the depth of the recess 14 is larger than the thickness of the semiconductor element 12 as described above, protrusion of the loop of the wire 18 for connecting both terminals, from the plane coil 10 can be reduced to as small as possible.

Figure 30B:
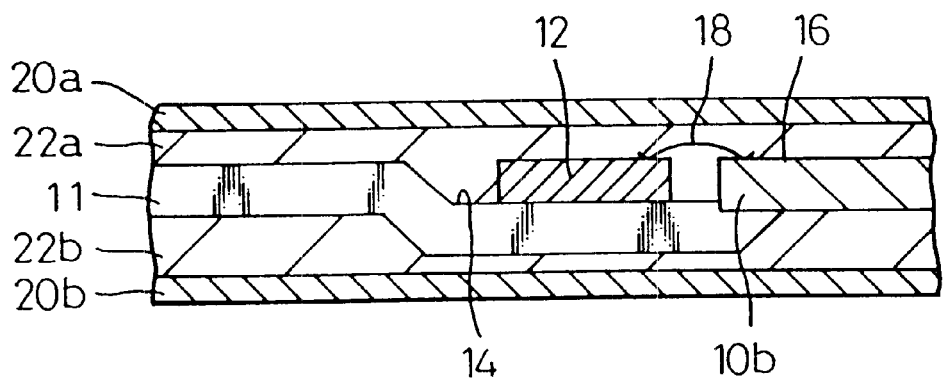

On the other hand, FIG. 30(b) is a view showing an example in which the depth of the recess 14, which is formed in the conductor line 11 of the plane coil 10, is substantially the same as the thickness of the semiconductor element 12. In this example, the connecting face 16 of the terminal 10b (10a) of the plane coil 10 is substantially the same as the forming face of the electrode terminals 12a, 12b of the semiconductor element 12. Therefore, it is possible to omit the process of squeezing the terminal 10b (10a) of the plane coil 10.

As described above, in the IC cards shown in FIGS. 29, 30(a), 30(b), the connecting faces 16 of the terminals 10a, 10b of the plane coil 10 are substantially the same as the forming faces of the electrode terminals 12a, 12b of the semiconductor element 12. Therefore, it is possible to carry out wire bonding by the method of wedge bonding or ball bonding. Therefore, as shown in FIG. 2, while the loop protruding from the face of the plane coil 10 is reduced to as small as possible, the terminals 10a, 10b of the plane coil 10 and the electrode terminals 12a, 12b of the semiconductor element 12 can be electrically connected with each other by the wires 18, 18 made of gold, platinum or aluminum.

In the same manner as that shown in FIG. 2, in FIGS. 30(a) and 30(b), while the loop protruding from the face of the plane coil 10 is reduced to as small as possible, the terminals 10a, 10b of the plane coil 10 and the electrode terminals 12a, 12b of the semiconductor element 12 can be electrically connected with each other by the wires 18, 18.

Figure 31:
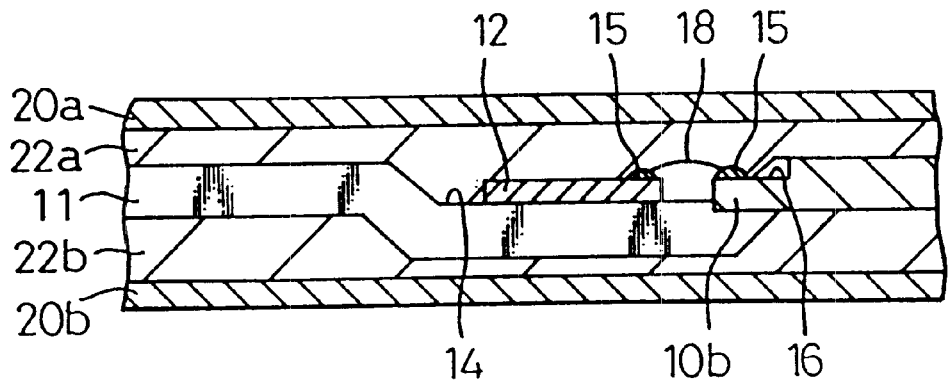
FIG. 31 is a partial cross-sectional view for explaining another variation of the IC card according to the present invention.

In order to prevent the deformation of the wires 18, it is preferable that the contact-bonding sections of the terminal 10b of the plane coil 10 and the electrode terminal 12b of the semiconductor element 12 are fixed by resin 15, 15 as shown in FIG. 31, especially by resin hardened by ultraviolet rays.

Figure 29:
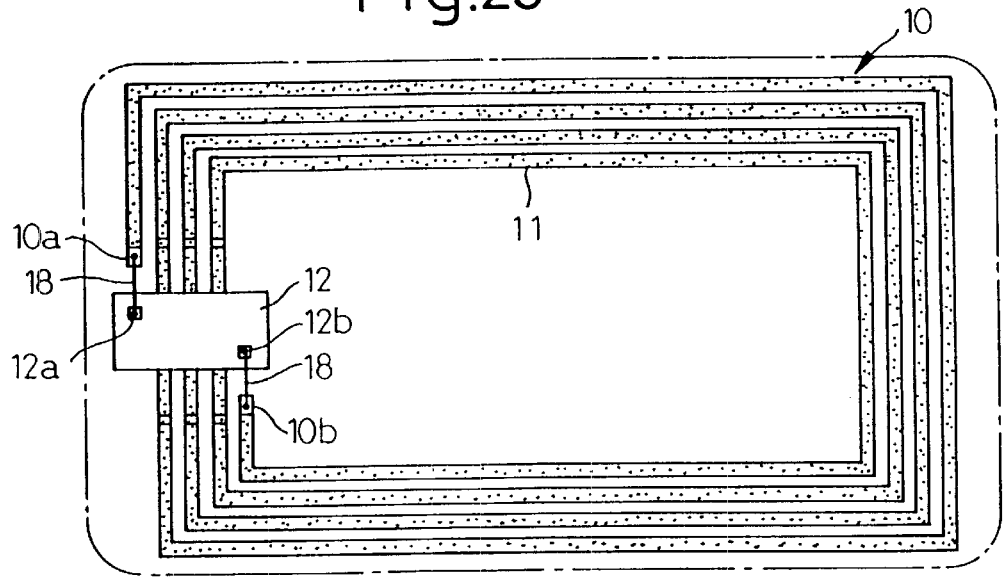
FIG. 29 is a plan view for explaining another example of the IC card according to the present invention.

In the plane coils 10 shown in FIGS. 29 to 31, the connecting faces 16 of the terminals 10a, 10b, which have been subjected to squeezing, may be in substantially the same plane as that including the forming faces of the electrode terminals 12a, 12b of the semiconductor element 12, and the configurations may be arbitrarily determined. It is preferable that the terminals 10a, 10b of the plane coils 10 shown in FIGS. 29, 30(a), 31 are formed into the terminal configuration shown in FIG. 7.

Figure 32:
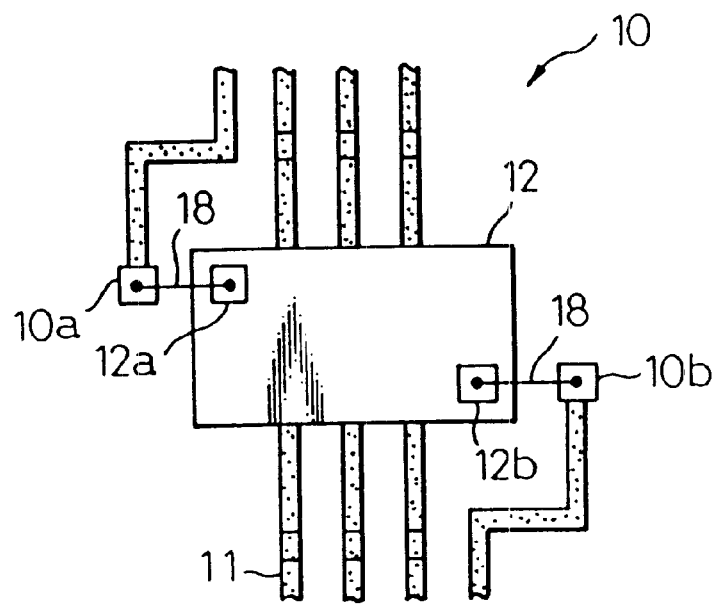
FIG. 32 is a partial plan view for explaining another variation of the IC card according to the present invention.
Figure 33:
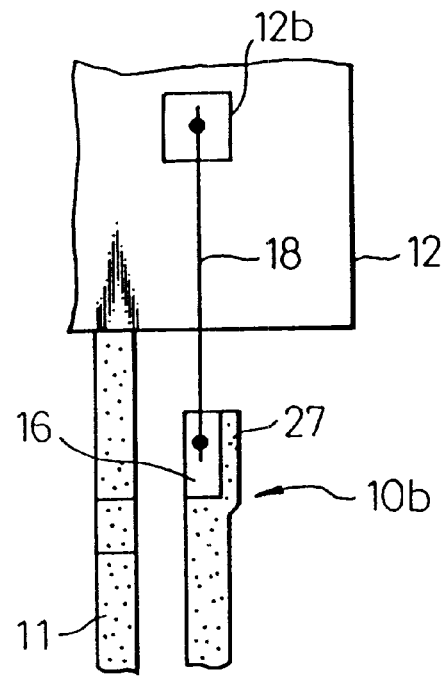
FIG. 33 is a partial plan view for explaining another variation of the IC card according to the present invention.

The terminals 10a, 10b of the plane coil 10 may be respectively connected with the electrode terminals 12a, 12b of the semiconductor element 12 in such a manner that the terminals 10a, 10b are arranged at positions close to the electrode terminals 12a, 12b located inside and outside the plane coil 10 being distant from the semiconductor element 12 because of the operation of the bonding device, and these terminals 10a, 10b are connected with the electrode terminals 12a, 12b. FIG. 32 is a view showing a case in which the wires 18, 18 for connecting both terminals are stretched in a direction perpendicular to the conductor line 11.

When the terminals 10a, 10b of the plane coil 10 shown in FIG. 32 are subjected to squeezing, the terminal shown in FIG. 9 is preferably used.

Figure 34:
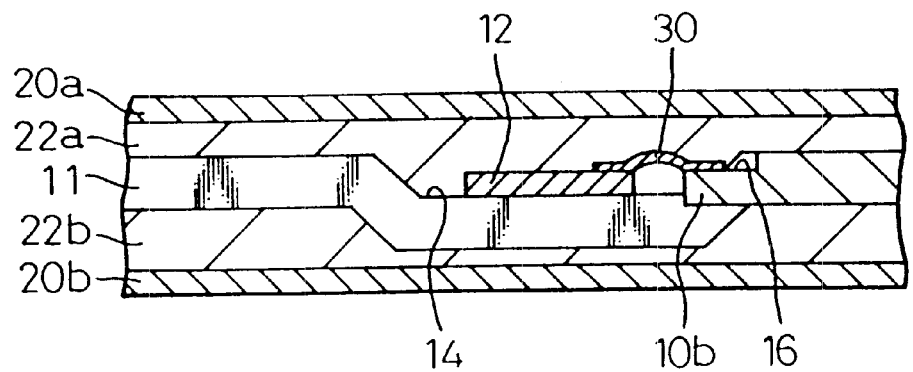
FIG. 34 is a partial cross-sectional view for explaining another variation of the IC card according to the present invention.

There may be a problem in which electric power generated in the plane coil 10 by electromagnetic induction is not sufficiently transmitted to the semiconductor element 12. In order to solve the above problem, it is preferable that the terminals 10a, 10b of the plane coil 10 and the electrode terminals 12a, 12b of the semiconductor element 12 are connected by ribbon-shaped connecting metallic members 30 as shown in FIG. 34 in the same manner as that of the example shown in FIG. 14.

Figure 35A:
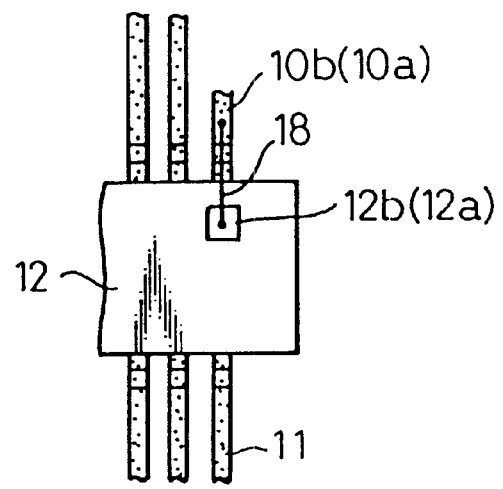
FIGS. 35(a) and 35(b) are respectively a partial plan view and a partial cross-sectional view for explaining another variation of the IC card according to the present invention.
Figure 35B:
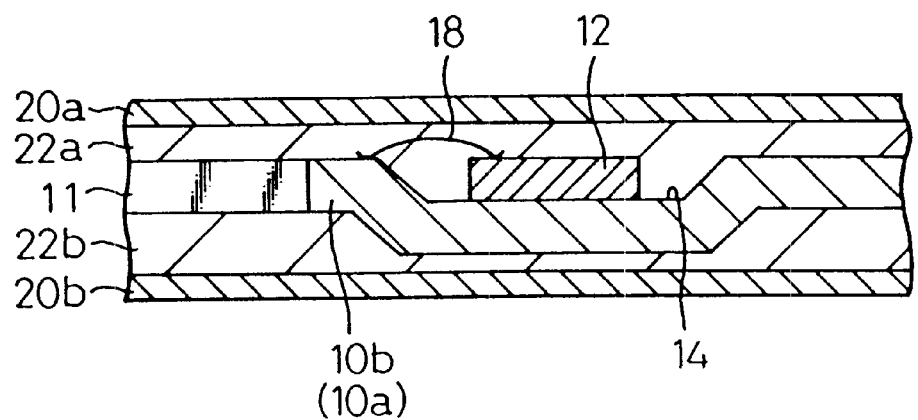

In FIGS. 29 to 34, no recesses 14 are formed in portions close to the terminals 10a, 10b of the plane coils 10. However, as shown in FIGS. 35(a) and 35(b), the recess 14 may be formed close to the terminal 10b (10a). In these views, the bottom face of the recess 14 is larger than that of a case in which the recess 14 is not formed close to the terminal 10b (10a). Therefore, it is possible to conduct wire bonding under the condition that the semiconductor element 12 is stably put on the bottom face of the recess 14.

Figure 36:
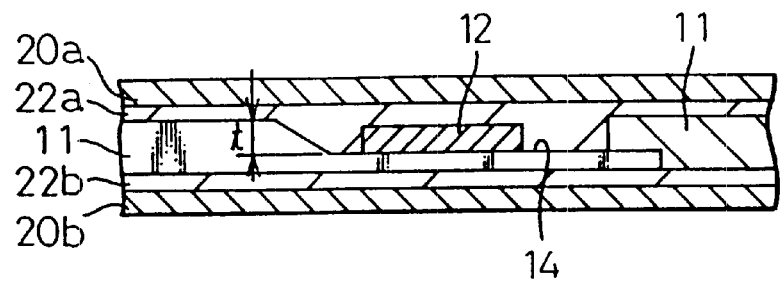
FIG. 36 is a partial cross-sectional view for explaining another variation of the IC card according to the present invention.

The recess 14 formed in the plane coil 10 is formed in such a manner that the conductor line 11 is bent. Other than that, since the conductor line 11 is thicker than the semiconductor element 12, in the same manner as that shown in FIG. 19, a middle portion of the conductor line 11 is subjected to squeezing, so that the recess 14 can be formed as shown in FIG. 36. In this case, the plane coil 10 and the semiconductor element 12 can be positioned at the center of the IC card in the thickness direction. Therefore, the IC card can be made thin. In this case, the semiconductor element 12 and the wire 18 are housed in a range of thickness t of the conductor line 11.

Figure 37:
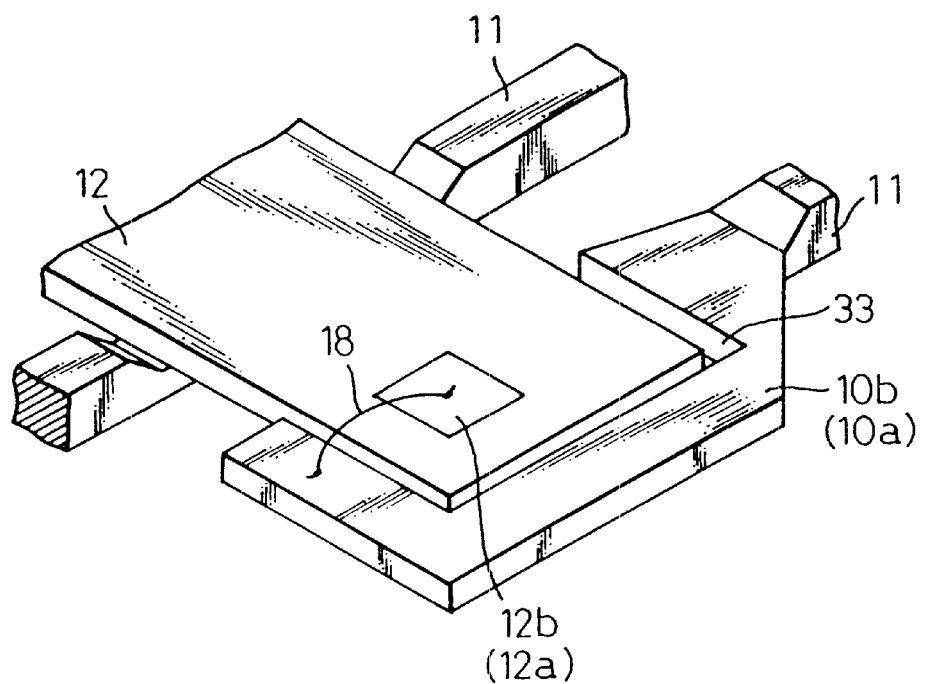
FIG. 37 is a partial perspective view for explaining another variation of the IC card according to the present invention.

Further, the terminals 10a, 10b of the plane coil 10 may be composed as follows. As shown in FIG. 37, the connecting face of the terminal 10b (10a), which has been subjected to squeezing, of the plane coil 10, is extended, and the wire 18, one end of which is connected with the electrode terminal 12b (12a) of the semiconductor element 12, may be connected with the terminal 10b (10a) at the other end. In this terminal 10b (10a) of the plane coil 10, there is formed a C-shaped recess 33 into which an end portion of the semiconductor element 12 having the electrode terminal 12b (12a) is inserted. When the end portion of the semiconductor element 12 is inserted into this recess 33, the terminal 10b (10a) is extended along an end edge of the end portion of the semiconductor element 12 in such a manner that the end portion of the semiconductor element 12 having the electrode terminal 12b (12a), which is connected with the terminal 10b (10a) of the plane coil 10, is surrounded. Due to the above arrangement, the semiconductor element 12 can be easily positioned, and the length of the wire 18 can be reduced. Therefore, the above arrangement is preferably used. Also in this case, it is preferable that, after the semiconductor element 12 and the conductor line 11 of the plane coil 10 have been made to adhere to each other by adhesive, the wire 18 is bonded.

Figure 38A:
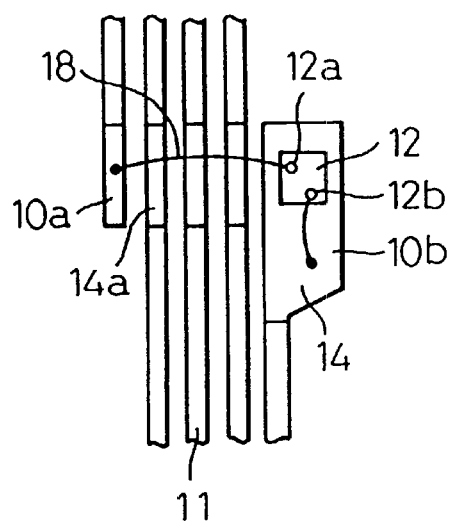
FIGS. 38(a) and 38(b) are respectively a partial plan view and a partial side view for explaining another variation of the IC card according to the present invention.
Figure 38B:
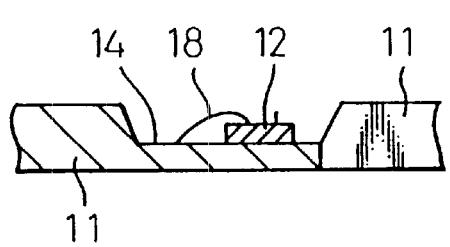

FIGS. 38(a) and 38(b) are views showing an example in which one 10b of the terminals of the plane coil 10 is subjected to squeezing so that the recess 14 is formed as a mounting section of the semiconductor element 12, and the connecting face of the terminal 10b is further extended and the semiconductor element 12 is mounted on the terminal 10b. On the terminal 10b, the electrode terminal 12b of the semiconductor element 12 and the terminal 10b are connected with each other by a common wire or a covered wire. The other terminal 10a of the plane coil 10 and the electrode terminal 12a of the semiconductor element 12 are connected with each other by the wire 18 in such a manner that the wire 18 crosses the conductor line 11, which are interposed between the terminals 10a and 10b, in the perpendicular direction. The terminal 10a is subjected to squeezing, and at the same time, a portion of the conductor line 11, through which the wire passes, is subjected to squeezing, so that the through-recess 14a is formed. Due to the above structure, the wire 18 does not protrude from a range of thickness of the conductor line 11. When an insulating resin, which is an electrically insulating material, is coated at least in a portion, through which the wire 18 passes, on the inner face of the recess 14a, or alternatively when an insulating tape having an electrically insulating property is made to adhere to this portion, connection can be accomplished without causing electrical short-circuit even if the common wire 18 is used.

Figure 39:
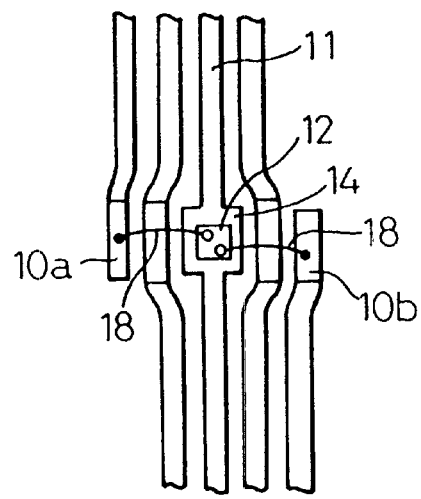
FIG. 39 is a partial plan view for explaining another variation of the IC card according to the present invention.

FIG. 39 is a view showing an example in which a middle portion of the conductor line 11, except for the terminals 10a, 10b, is subjected to squeezing, so that the recess 14 is formed as a mounting section in which the semiconductor element 12 is mounted. In the recess 14, the semiconductor element 12 is mounted. In order to mount the semiconductor element 12, the width of the recess 14 is made larger than the width of the conductor line 11, and the conductor line 11 adjacent to the mounting section is arranged outside the recess 14. Also in this case, the terminals 10a, 10b are subjected to squeezing so that the faces can be at the same level as that of the recess 14, and at the same time, a portion of the conductor wire 11, which is interposed between the mounting section and the terminals 10a, 10b and crossed by the wire 18, is subjected to squeezing, so that the through-recess is formed. In this way, the wire 18 connecting the terminals 10a, 10b with the electrode terminals 12a, 12b of the semiconductor element 12 does not protrude from a range of thickness of the conductor line 11. In this connection, it is preferable to use a covered wire for the wire 18 connecting the electrode terminals 12a, 12b with terminals 10a, 10b. When the inner face of the through-recess is covered with an electrically insulating material, connection can be accomplished by a common wire 18.

When the size of the semiconductor element 12 is small, it is possible to incorporate the semiconductor element 12 into the recess 14 which has been formed on the conductor line 11 by means of squeezing.

The method in which the semiconductor element 10 is incorporated into the recess 14 is advantageous in that a standard plane coil 10 can be formed irrespective of the size of the semiconductor element 12. When the semiconductor element 12 is smaller than the width, which is the width of the passing conductor line 11 of the plane coil 10, it is preferable to use a method in which the semiconductor element 12 is incorporated into the recess 14.

In the IC cards described above, the conductor line 11 composing the plane coil 10 is bent or subjected to squeezing so as to form the recess 14. However, as shown in FIGS. 40 and 41, when a portion close to the end of the conductor line 11 is bent and the end of the conductor line 11 is subjected to squeezing, the connecting faces 16 of the terminals 10a, 10b of the plane coil 10 can be made to be substantially in the same plane as that including the forming plane on which the electrode terminals 12a, 12b of the semiconductor element 12 are formed.

Figure 40:
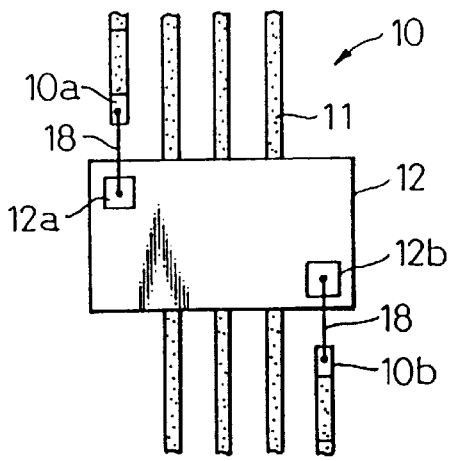
FIG. 40 is a partial plan view for explaining another variation of the IC card according to the present invention.
Figure 41:
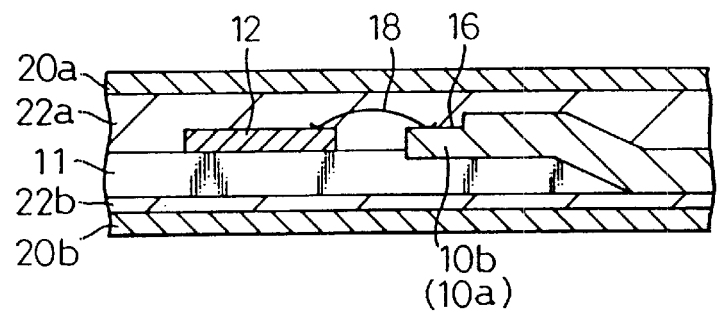
FIG. 41 is a partial cross-sectional view for explaining the IC card shown in FIG. 40.

In FIGS. 40 and 41, when the terminals 10a, 10b of the plane coil 10 and the electrode terminals 12a, 12b of the semiconductor element 12 are bonded to each other by the wires 18, 18, positioning of wire bonding can be easily carried out by making the conductor wire 11 of the plane coil 10, which passes on a lower face of the semiconductor element 12, adhere to the semiconductor element 12. Therefore, it is preferable to make the conductor wire 11 adhere to the semiconductor element 12.

In this connection, when a quantity of bending in a portion close to the conductor line 11 is adjusted, the respective connecting faces 16 of the terminals 10a, 10b of the plane coil 10 can be made to be substantially the same plane as the forming planes on which the electrode terminals 12a, 12b of the semiconductor element 12 are formed, without conducting squeezing.

Figure 42:
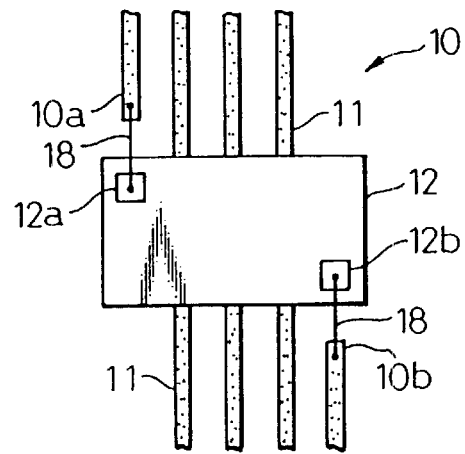
FIG. 42 is a partial plan view for explaining another variation of the IC card according to the present invention.

In the above IC card, the conductor line 11 forming the plane coil 10 is thicker than the semiconductor element 12. When the thickness of the semiconductor element 12 is substantially the same as that of the conductor line 11, the following IC card arrangement may be adopted. As shown in FIG. 42, the semiconductor element 10 is arranged in such a manner that a plane reverse to the forming plane on which the electrode terminals 12a, 12b are formed is located on the conductor line 11 side with respect to the plane coil 10, and the terminals 10a, 10b are connected with the electrode terminals 12a, 12b by the wires 18, 18 without conducting squeezing on the terminals 10a, 10b of the plane coil 10. In this case, portions of the wires 18, 18 protrude from the conductor line 11, however, the quantity of protrusion is small. Therefore, the wires 18, 18 can be sufficiently sealed by the adhesive layers 22a, 22b formed on one side of the resin films 20a, 20b, and deformation is seldom caused in the process of sealing.

Figure 43:
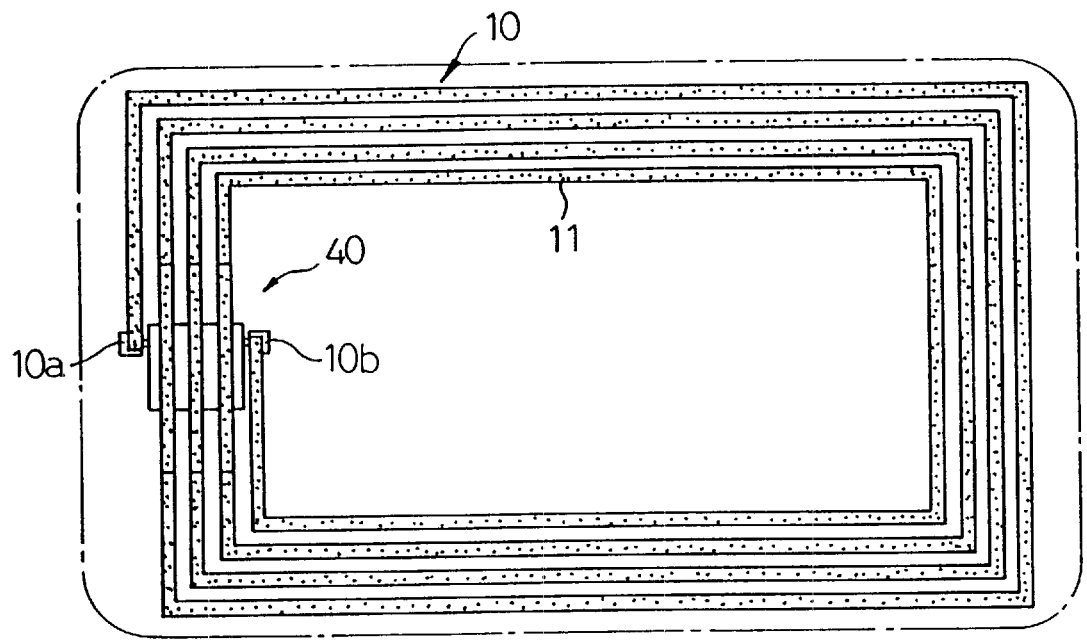
FIG. 43 is a plan view for explaining still another variation of the IC card according to the present invention.
Figure 44:
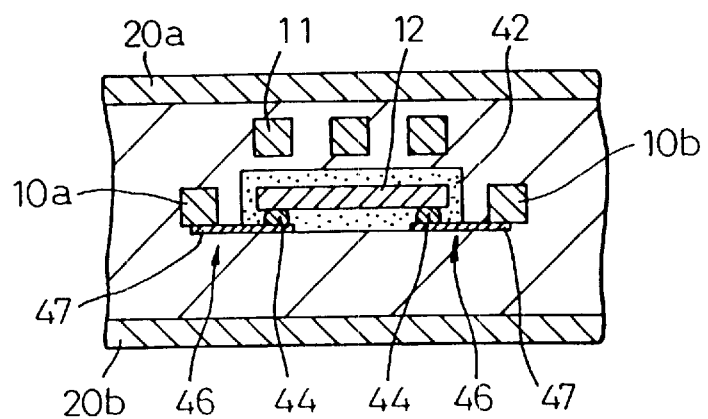
FIG. 44 is a partial cross-sectional view of the IC card shown in FIG. 43.
Figure 45:
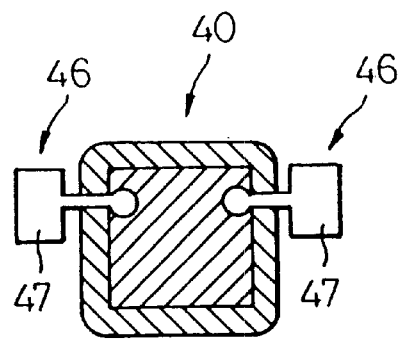
FIG. 45 is a plan view showing a module body 40 used in the IC card shown in FIG. 43.

In the IC cards explained by FIGS. 29 to 42, the wires 18 or the ribbon-shaped connecting metal members 30 are used for connecting the plane coils 10 and the semiconductor elements 12. However, as shown in FIG. 43, it is possible to use a module body 40 in which the semiconductor element is molded by resin. This module body 40 is subjected to resin molding as follows. As shown in FIGS. 44 and 45, there are provided leads 46, 46 which are connected via the solder bumps 44, 44 and the electrode terminals 12a, 12b of the semiconductor element 12. Resin molding is conducted so that the connecting sections 47, 47 formed at the ends of the leads can be exposed.

The thus formed connecting sections 47, 47 of the module body 40 are joined to the terminals 10a, 10b of the plane coil 10. Connection of both terminals is performed as follows. The connecting faces of the connecting sections 47, 47 are plated with gold, tin or solder, and the electrode terminals 12a, 12b of the semiconductor element 12 and the terminals 10a, 10b of the plane coil 10 are plated with gold, and both terminals to be connected are heated and contact-bonded, so that they are connected with each other by the thus formed eutectic alloy. On the other hand, in the case where the connecting sections 47, 47 are made of aluminum, both terminals can be connected with each other without conducting metal plating on the connecting faces of the connecting sections 47, 47. It is also possible to connect both terminals with each other by using an electrically conductive adhesive.

As shown in FIG. 43, there is formed a recess, into which the module body 40 is inserted while the conductor line 11 is bent, in a portion of the plane coil into which the module body 40 is incorporated.

Figure 46:
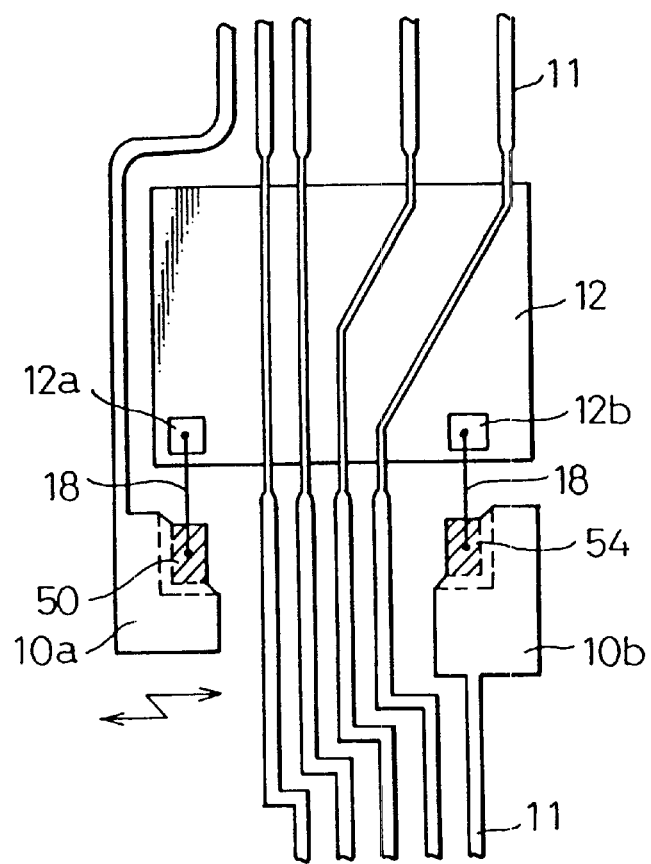
FIG. 46 is a partial plan view for explaining another variation of the IC card according to the present invention.

In the IC card explained above, the terminals (bonding pads) 12a, 12b of the semiconductor element 12 are formed on both sides with respect to the direction in which the conductor line 11 of the plane coil 10, which is wound a plurality of times, is extended. On the other hand, in the IC card shown in FIG. 46, the bonding pads 12a, 12b of the semiconductor element 12 are formed on one side with respect to the direction in which the conductor line 11 of the plane coil 10 is extended. In this example, one terminal 10a (for example, the terminal of the outside end) of the plane coil 10 is arranged outside the semiconductor element 12 and extended to a position which corresponds to the other terminal 10b (for example, the terminal of the inside end) of the plane coil 10. The terminals 10a, 10b are composed of pads on which bonding can be conducted. Bonding is conducted between the pads and the electrode terminals 12a, 12b of the semiconductor element 12 located close to the terminals 10a, 10b by the wires 18, 18. In this connection, on the contrary to the above, the other end 10b of the plane coil 10 may be arranged inside the semiconductor element 12.

Figure 47A:
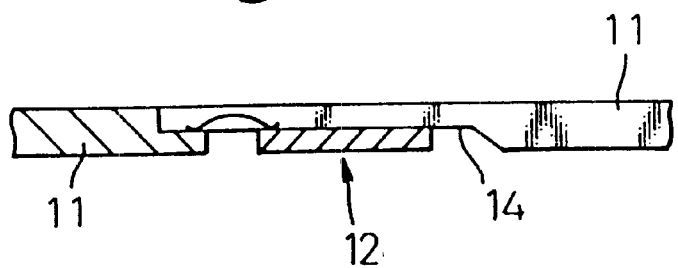
FIGS. 47(a) to 47(c) are partial cross-sectional views for showing a forming process of another variation of the IC card according to the present invention.
Figure 47B:
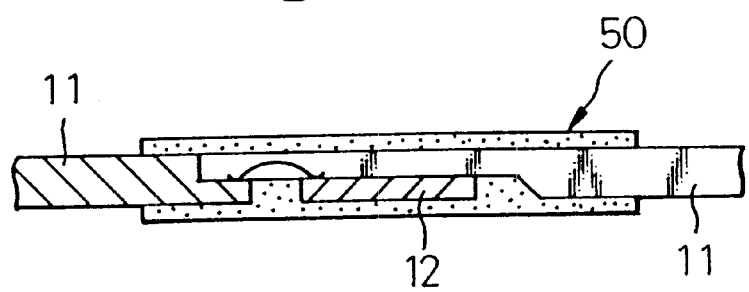
Figure 47C:
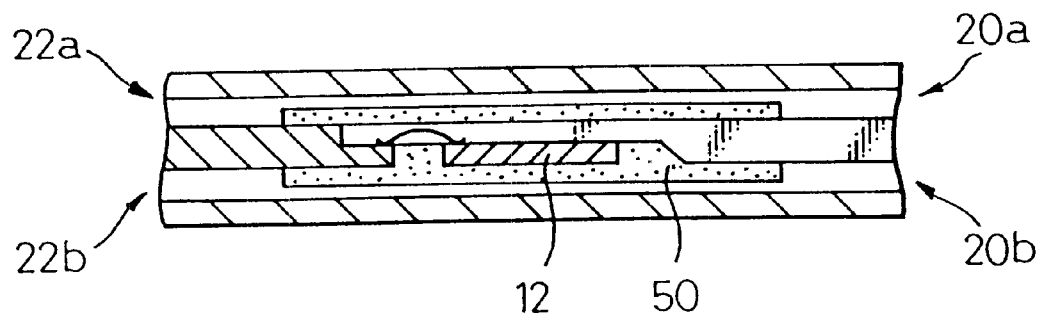
Figure 48:
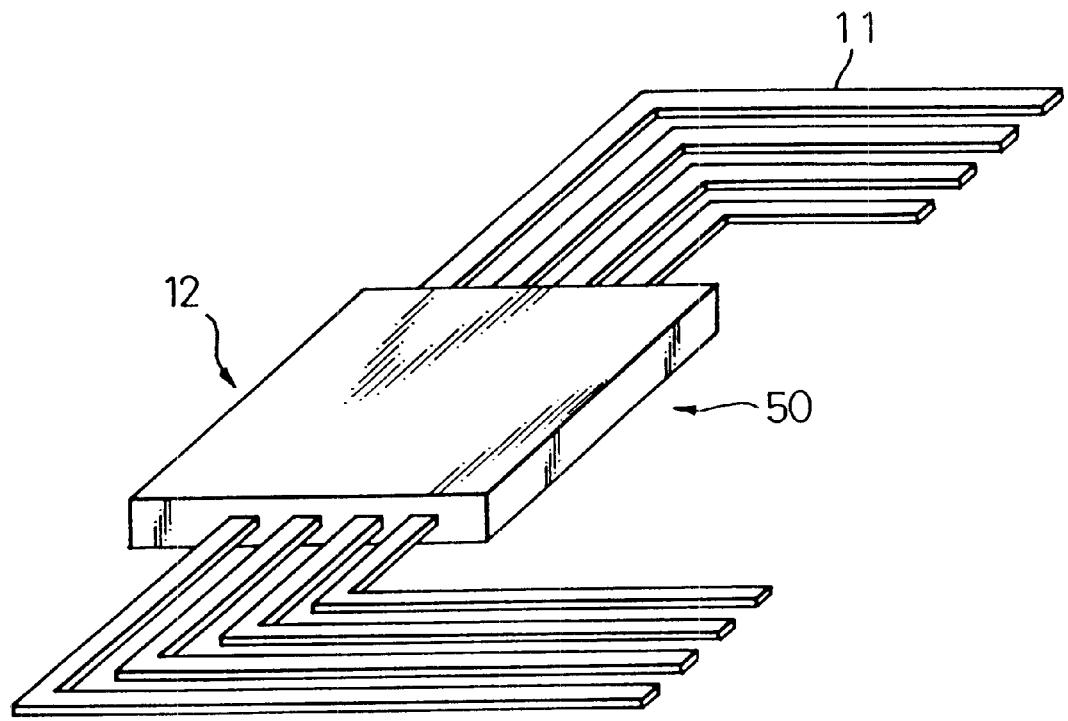
FIG. 48 is a perspective view showing a variation.

FIGS. 47(*a*) to 47(*c*) are views showing a manufacturing process in which the semiconductor element 12 is molded and fixed by sealing resin, and the thus molded semiconductor element 12 is enclosed by the resin films 20*a*, 20*b* so that the IC card can be formed. First, as shown in FIG. 47(*a*), the conductor line 11 composing the plane coil 10 is squeezed, so that the recess 14 is formed. The semiconductor element 12 is incorporated into this recess 14. Next, as shown in FIG. 47(*b*), molding is conducted on the semiconductor element 12 and the semiconductor element mounting section by the sealing resin 50. In this case, it is preferable that transfer molding is conducted. FIG. 48 is a perspective view showing a state of the semiconductor element after molding. Next, the adhesive layers 22*a*, 22*b* are provided on the upper and the lower face of the plane coil 10, and the plane coil 10 is interposed between the resin film 20*a*, 20*b*. In this way, the IC card is formed.

Figure 49:
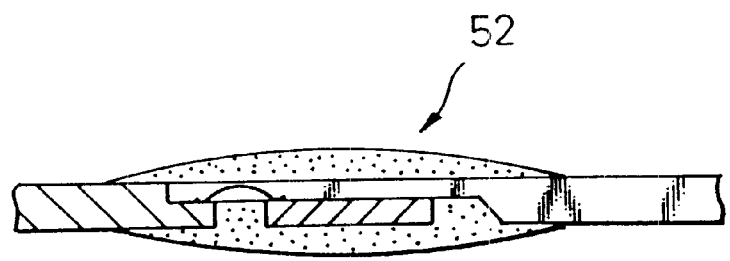
FIG. 49 is a partial cross-sectional view of a variation in which potting resin is used.
Figure 50:
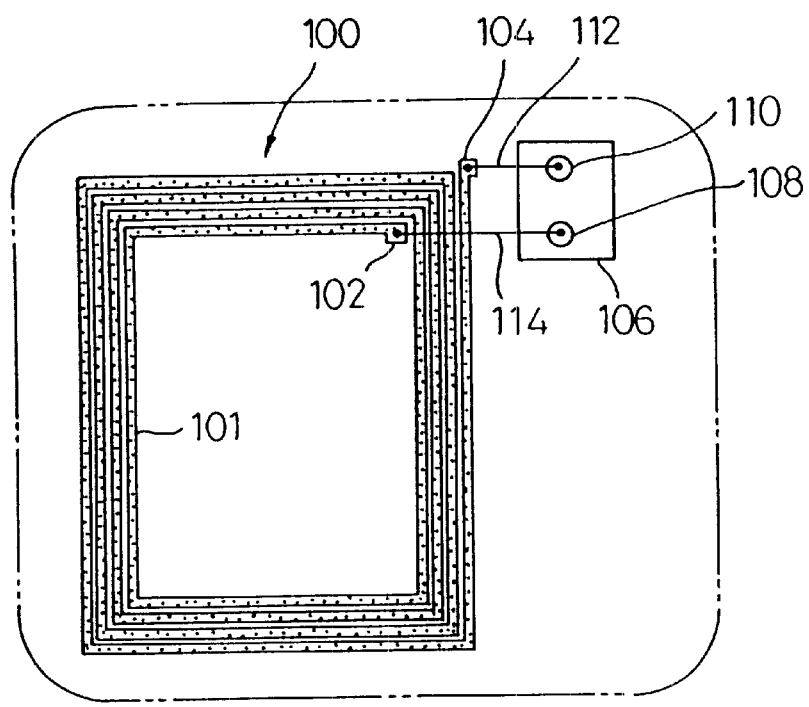
FIG. 50 is a plan view for explaining a conventional IC card.

In this connection, when the semiconductor element 12 is sealed by resin, sealing resin may be formed by means of molding as shown in FIGS. 47(*a*) to 47(*c*). However, it is possible to form sealing resin by means of potting 52, the outline of which is shown in FIG. 49.

When the semiconductor element 12 is sealed by resin as described above, the semiconductor element 12 can be reinforced, and it becomes possible to reduce an intensity of stress given to the semiconductor element 12 in the manufacturing process of lamination in which the semiconductor element 12 and the plane coil 10 are enclosed by the resin films 20*a*, 20*b*. Therefore, it is possible to prevent the semiconductor element 12 from cracking, that is, damage of the semiconductor element 12 can be prevented. Even when the IC card is used after it has been manufactured, it is possible to reduce an intensity of stress given to IC card when it is bent. Therefore, the semiconductor element can be prevented from being damaged.

INDUSTRIAL POSSIBILITY

According to the IC card and the frame for the IC card of the present invention, the terminals of the plane coil formed by punching and the electrode terminals of the semiconductor element can be easily connected with each other without crossing of the connecting wires on the plane coil. Therefore, the costs of the IC card and the frame for the IC card can be lowered, the IC card and the frame can be mass-produced.

DESCRIPTION OF REFERENCE NUMERALS

| | |
|---|---|
| 10 | plane coil |
| 10a, 10b | terminal of plane coil 10 |
| 11 | conductor line |
| 12 | semiconductor element |
| 12a, 12b | terminal of semiconductor element 12 |
| 14 | recess |
| 16 | connecting face of terminal 10b (10a) |
| 18 | wire |
| 20a, 20b | resin film |
| 22a, 22b | adhesive layer |
| 25 | supporting wire |
| 27 | wall |
| 30 | connecting metallic member |
| 32 | protrusion |
| 33 | recess |
| 40 | module body |
| 44 | bump |
| 46 | lead |
| 47 | connecting section |

-continued

DESCRIPTION OF REFERENCE NUMERALS

| | |
|---|---|
| 50 | sealing resin (mold resin) |
| 52 | sealing resin (potting resin) |
| 54 | connecting portion |
| 60 | rail |
| 62 | connecting portion |

What is claimed is:

1. A frame for an IC card used for manufacturing the IC card having a plane coil in which a conductor line is wound a plurality of times in substantially the same plane, the plane coil being formed by punching or etching a metal plate, said plane coil having recess that defines a mounting area for a semiconductor to be mounted on the recess, terminals of the plane coil and electrode terminals of the semiconductor element being electrically connected to each other, wherein the plane coil includes an inside terminal formed inside the coil, to which the electrode terminal of the semiconductor element located on the same side with respect to the inside and outside of the coil is electrically connected and the plane coil also includes an outside terminal formed outside the coil.

2. A frame for an IC card according to claim 1, wherein the recess is formed in the plane coil by bending the conductor line forming the plane coil.

3. A frame for an IC card according to claim 1, wherein the recess is formed in the plane coil by conducting squeezing on a middle portion of the conductor line forming the plane coil.

4. A frame for an IC card according to claim 1, wherein one of the inside and the outside terminal is formed as a mounting section in which the semiconductor element is mounted on the terminal face.

5. A frame for an IC card according to claim 4, wherein the mounting section formed from a recess, the width of which is wider than that of the conductor line, is formed in the conductor line by squeezing the conductor line, and a through-recess is formed in a portion of the conductor line passing through an intermediate portion interposed between one of the terminals and the other terminal where the bonding wire for connecting the other terminal with the electrode terminal of the semiconductor element crosses.

6. A frame for an IC card according to claim 5, wherein at least an inner face of the through-recess on which the bonding wire passes is covered with an electrically insulating material.

7. A frame for an IC card according to claim 1, wherein a middle portion of at least one conductor line passing through an intermediate portion interposed between the inside terminal and the outside terminal is formed into the mounting section in which the semiconductor element is mounted on the conductor line face.

8. A frame for an IC card according to claim 7, wherein the mounting section formed from a recess, the width of which is wider than that of the conductor line, is formed in the conductor line by squeezing the conductor line, and a through-recess is formed in a portion of the conductor line passing through an intermediate portion interposed between the mounting section and the other terminal where the bonding wire crosses and also formed in a portion of the conductor line passing through an intermediate portion interposed between the mounting section and the other terminal where the bonding wire crosses.

9. A frame for an IC card according to claim 1, wherein a plurality of plane coils of the same configuration are continuously arranged between two parallel rails in the longitudinal direction of the rails.

10. A frame for an IC card according to claim 9, wherein an outermost conductor line in the conductor lines forming the plane coil is thicker than other conductor lines.

11. A frame for an IC card according to claim 9, wherein the outermost conductor lines of the plane coil, which are adjacent to each other, are connected by a connecting section.

12. A frame for an IC card used for manufacturing the IC card having a plane coil in which a conductor line is wound a plurality of times in substantially the same plane, said plane coil having a top surface and an opening that defines a mounting area for a semiconductor element to be mounted, terminals of the plane coil and electrode terminals of the semiconductor element being electrically connected to each other, wherein the plane coil includes an inside terminal formed inside the coil, to which the electrode terminal of the semiconductor element located on the same side with respect to the inside and outside of the coil is electrically connected and the plane coil also includes an outside terminal formed outside the coil, wherein said opening is in the plane of the coil below the surface of the coil, and wherein at least a portion of the mounted semiconductor is disposed within the opening below the top of the coil, and further having a through-recess formed in a portion of the conductor line passing through an intermediate portion interposed between one of the terminals and the other terminal where the bonding wire for connecting the other terminal with the electrode terminal of the semiconductor element crosses.

13. A frame for an IC card according to claim 12, wherein at least an inner face of the through-recess on which the bonding wire passes is covered with an electrically insulating material.

14. A frame for an IC card according to claim 13, wherein an outermost conductor line in the conductor lines forming the plane coil is thicker than other conductor lines.

15. A frame for an IC card according to claim 13, wherein the outermost conductor lines of the plane coil, which are adjacent to each other, are connected by a connecting section.

* * * * *

UNITED STATES PATENT AND TRADEMARK OFFICE
CERTIFICATE OF CORRECTION

PATENT NO.     : 6,452,806 B2
DATED          : September 17, 2002
INVENTOR(S)    : Ikeda et al.

It is certified that error appears in the above-identified patent and that said Letters Patent is hereby corrected as shown below:

<u>Title page,</u>
Please add item -- [73] Assignee: Shinko Electric Industries Co., Ltd. --.

Signed and Sealed this

Eighth Day of April, 2003

JAMES E. ROGAN
*Director of the United States Patent and Trademark Office*